(12) United States Patent
Woo

(10) Patent No.: US 12,255,194 B2
(45) Date of Patent: Mar. 18, 2025

(54) DISPLAY DEVICE

(71) Applicant: Samsung Display Co., LTD., Yongin-si (KR)

(72) Inventor: Min Kyu Woo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 475 days.

(21) Appl. No.: 17/832,066

(22) Filed: Jun. 3, 2022

(65) Prior Publication Data

US 2023/0120255 A1    Apr. 20, 2023

(30) Foreign Application Priority Data

Oct. 15, 2021    (KR) .................. 10-2021-0137375

(51) Int. Cl.
| | |
|---|---|
| *H01L 25/16* | (2023.01) |
| *H01L 23/00* | (2006.01) |
| *H01L 33/62* | (2010.01) |
| *G09G 3/32* | (2016.01) |
| *H01L 33/32* | (2010.01) |

(52) U.S. Cl.
CPC ............ *H01L 25/167* (2013.01); *H01L 24/24* (2013.01); *H01L 24/25* (2013.01); *H01L 33/62* (2013.01); *G09G 3/32* (2013.01); *G09G 2300/0842* (2013.01); *H01L 33/325* (2013.01); *H01L 2224/24051* (2013.01); *H01L 2224/24145* (2013.01); *H01L 2224/25175* (2013.01)

(58) Field of Classification Search
CPC ......... G09G 3/32; H01L 25/167; H01L 24/24; H01L 24/25; H01L 2224/25175; H10K 59/131; H10K 59/126; H10K 59/122
See application file for complete search history.

(56) References Cited

U.S. PATENT DOCUMENTS

| | | | |
|---|---|---|---|
| 2019/0206949 A1* | 7/2019 | Park | ................. H10K 59/122 |
| 2022/0181382 A1 | 6/2022 | Park et al. | |

FOREIGN PATENT DOCUMENTS

| | | |
|---|---|---|
| KR | 10-2020-0042075 | 4/2020 |
| KR | 10-2022-0078798 | 6/2022 |
| WO | 2022/119279 | 6/2022 |

\* cited by examiner

*Primary Examiner* — John A Bodnar
(74) *Attorney, Agent, or Firm* — KILE PARK REED & HOUTTEMAN PLLC

(57) ABSTRACT

A display device includes a first electrode, second electrodes, light emitting elements, a bank layer, and connection electrodes. Each of the second electrodes comprises an electrode stem part overlapping the bank layer and electrode branch parts branching from the electrode stem part and disposed partially in an emission area, and the connection electrodes comprise a first connection electrode disposed on the first electrode, overlapping an upper bank part of the bank layer and having a part disposed in a first sub-area, a second connection electrode disposed on a first electrode branch part of one of the second electrodes, overlapping a lower bank part of the bank layer and having a part disposed in a second sub-area, and a third connection electrode disposed on second electrode branch parts of different second electrodes of the second electrodes and on the first electrode and surrounding a part of the first connection electrode.

20 Claims, 18 Drawing Sheets

DISPLAY DEVICE

CROSS REFERENCE TO RELATED APPLICATION(S)

This application claims priority to and benefits of Korean Patent Application No. 10-2021-0137375 under 35 U.S.C. 119, filed in the Korean Intellectual Property Office on Oct. 15, 2021, the entire contents of which are incorporated herein by reference.

BACKGROUND

1. Technical Field

The disclosure relates to a display device

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects of the disclosure provide a display device which includes electrodes extending in different directions to prevent an electrical short circuit.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure, a display device comprising a first electrode disposed on a substrate and extending in a first direction, second electrodes spaced apart from the first electrode in a second direction, the first electrode being disposed between the plurality of second electrodes, light emitting elements disposed on the first electrode and the second electrodes, a bank layer extending in the first direction and the second direction and surrounding an emission area in which the light emitting elements are disposed, a first sub-area disposed on a side of the emission area in the first direction, and a second sub-area disposed on another side of the emission area in the first direction, and connection electrodes disposed on at least one of the first electrode and the second electrodes and electrically connected to the light emitting elements. Each of the second electrodes may comprise an electrode stem part overlapping the bank layer in a plan view and extending in the first direction, and electrode branch parts branching from the electrode stem part and disposed partially in the emission area. The connection electrodes may comprise a first connection electrode disposed on the first electrode, overlapping an upper bank part of the bank layer disposed above the emission area in a plan view, and having a part disposed in the first sub-area, a second connection electrode disposed on a first electrode branch part of one of the second electrodes, overlapping a lower bank part of the bank layer disposed below the emission area in a plan view, and having a part disposed in the second sub-area, and a third connection electrode disposed on second electrode branch parts of different second electrodes of the second electrodes and on the first electrode and surrounding a part of the first connection electrode.

The first connection electrode may be spaced apart from the lower bank part of the bank layer in the first direction, and the second connection electrode may be spaced apart from the upper bank part of the bank layer in the first direction.

The third connection electrode may comprise a first extension part disposed on the second electrode branch part of one of the second electrodes, a second extension part disposed on the first electrode and spaced apart from the first connection electrode, and a first connection part electrically connecting the first extension part and the second extension part. The first connection part may be disposed on the lower bank part of the bank layer.

Each of the first extension part and the second extension part may be spaced apart from the upper bank part of the bank layer in the first direction.

The display device may further comprise a first insulating layer disposed on the first electrode and the second electrodes, a second insulating layer disposed on the light emitting elements, and a third insulating layer disposed on the second insulating layer. The light emitting elements may be disposed between the first insulating layer and the second insulating layer.

The first connection electrode and the second connection electrode may be disposed on the third insulating layer, and the third connection electrode may be disposed between the second insulating layer and the third insulating layer.

The first connection electrode and the second connection electrode may be disposed between the second insulating layer and the third insulating layer, and the third connection electrode may be disposed on the third insulating layer.

The first connection electrode may contact the first electrode through a first contact part disposed in the first sub-area, and the first contact part may penetrate the first insulating layer, the second insulating layer, and the third insulating layer to expose a part of the first electrode. The second connection electrode may electrically contact one of the second electrodes through a second contact part disposed in the second sub-area, and the second contact part may penetrate the first insulating layer, the second insulating layer, and the third insulating layer to expose a part of the second electrode.

The first electrode may extend from the first sub-area to the emission area and the second sub-area and may be disposed on a first electrode contact hole overlapping the upper bank part of the bank layer in a plan view. Each of the second electrodes may be disposed on a second electrode contact hole formed in a part of the bank layer which extends in the first direction.

The display device may further comprise a wiring connection electrode disposed in the first sub-area and spaced apart from the first electrode. A first separation part may be interposed between the wiring connection electrode and the first sub-area. The first electrode may be spaced apart from another first electrode in the first direction. A second separation part may be disposed in the second sub-area and interposed between the first electrode and the another first electrode.

The display device may further comprise a first bank pattern disposed between the substrate and the first electrode, and a plurality of second bank patterns disposed between the substrate and the second electrodes, respectively. The first bank pattern may do not overlap in a plan view a part of the bank layer which extends in the first direction, and each of the second bank patterns may overlap in a plan view the part of the bank layer which extends in the first direction.

The light emitting elements may comprise a first light emitting element disposed between the first bank pattern and one of the second bank patterns and disposed on the first electrode and the second electrode branch part of one of the second electrodes and a second light emitting element disposed between the first bank pattern and another one of the second bank patterns and disposed on the first electrode and the first electrode branch part of another one of the second electrodes.

The first connection electrode may electrically contact a first end of the first light emitting element. The second connection electrode may electrically contact a second end of the second light emitting element. The third connection electrode may electrically contact a second end of the first light emitting element and a first end of the second light emitting element.

According to an embodiment of the disclosure, a display device comprising a first electrode disposed on a substrate and extending in a first direction, a second electrode extending in the first direction and spaced apart from the first electrode in a second direction, light emitting elements disposed on the first electrode and the second electrode, a bank layer surrounding an emission area in which the light emitting elements are disposed and sub-areas spaced apart from the emission area in the first direction, a first connection electrode disposed on the first electrode and electrically connected to the light emitting elements, and a second connection electrode disposed on the second electrode and electrically connected to the light emitting elements. The first connection electrode may overlap a lower bank part of the bank layer disposed below the emission area in a plan view and have a part disposed in a first sub-area disposed on a side of the emission area in the first direction. The second connection electrode may overlap an upper bank part of the bank layer disposed above the emission area in a plan view and have a part disposed in a second sub-area disposed on another side of the emission area in the first direction.

The first connection electrode may be spaced apart from the upper bank part of the bank layer in the first direction, and the second connection electrode may be spaced apart from the lower bank part of the bank layer in the first direction.

The first electrode and the second electrode may be disposed over the emission area, the first sub-area, and the second sub-area to partially overlap the bank layer in a plan view. The first electrode may be disposed on a first electrode contact hole overlapping the bank layer in a plan view. The second electrode may be disposed on a second electrode contact hole overlapping the bank layer in a plan view.

The display device may further comprise a first insulating layer disposed on the first electrode and the second electrode, and a second insulating layer disposed on the light emitting elements. The light emitting elements may be disposed directly on the first insulating layer.

Each of the first connection electrode and the second connection electrode may be disposed on the first insulating layer and have a part in contact with the second insulating layer.

The first connection electrode may electrically contact the first electrode through a first contact part disposed in the first sub-area, and the first contact part may penetrate the first insulating layer and the second insulating layer. The second connection electrode may electrically contact the second electrode through a second contact part disposed in the second sub-area, and the second contact part may penetrate the first insulating layer and the second insulating layer.

The display device may further comprise a first bank pattern disposed between the substrate and the first electrode, and a second bank pattern disposed between the substrate and the second electrode. The light emitting elements may be disposed between the first bank pattern and the second bank pattern.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
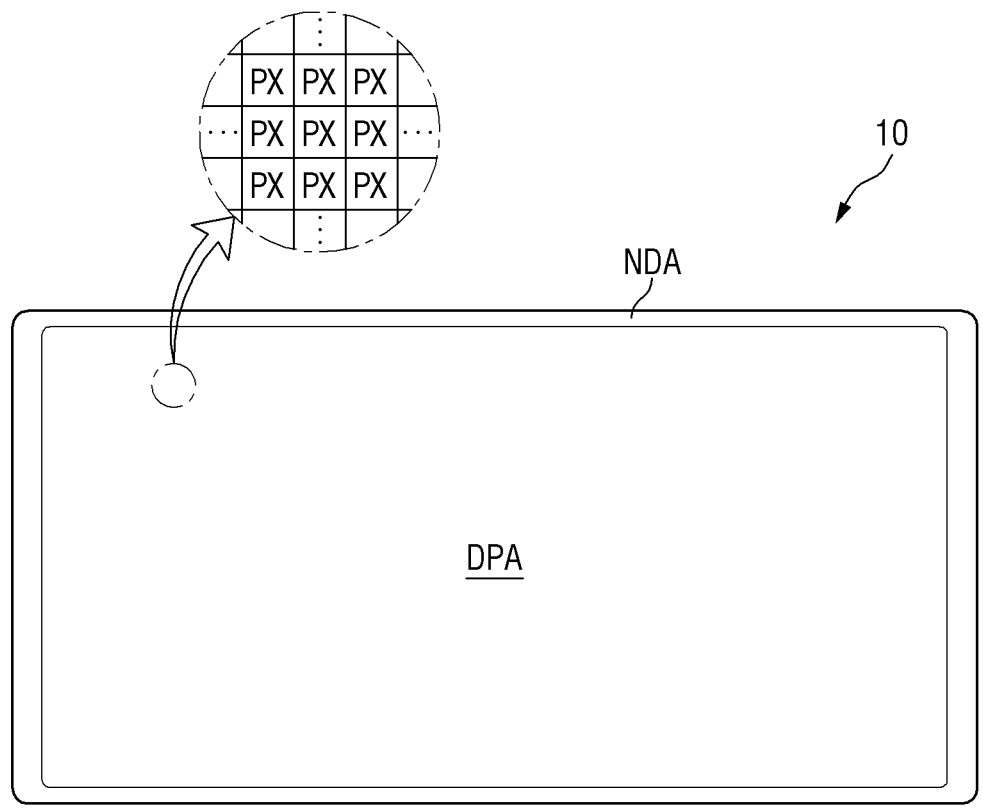
FIG. 1 is a schematic plan view of a display device according to an embodiment.

In the following description, for the purpose of explanation, numerous specific details are set forth in order to provide a thorough understanding of various embodiments or implementations of the disclosure. As used herein, "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure. Similarly, the second element could also be termed the first element.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

FIG. 1 is a schematic plan view of a display device 10 according to an embodiment.

Referring to FIG. 1, the display device 10 may display moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMI's), navigation devices, game machines, digital cameras and camcorders, all of which provide a display screen.

The display device 10 may include a display panel that provides the display screen. Examples of the display panel may include inorganic light emitting diode display panels, organic light emitting display panels, quantum dot light emitting display panels, plasma display panels, field emission display panels, or the like. A case where an inorganic light emitting diode display panel is applied as an example of the display panel will be described below, but the disclosure is not limited thereto, and other display panels may also be applied insofar as the same technical spirit is applicable.

The shape of the display device 10 may be variously modified. For example, the display device 10 may have various shapes such as a horizontally long (or elongated) rectangle, a vertically long (or elongated) rectangle, a square, a quadrangle with rounded corners (or vertices), other polygons, a circle, or the like. The shape of a display area DPA of the display device 10 may also be similar to the overall shape of the display device 10. In FIG. 1, the display device 10 has a rectangular shape that is long (or elongated) in a second direction DR2.

The display device 10 may include the display area DPA and a non-display area NDA. The display area DPA may be an area where a screen may be displayed, and the non-display area NDA may be an area where a screen is not displayed. The display area DPA may also be referred to as an active area, and the non-display area NDA may also be referred to as an inactive area. The display area DPA may generally occupy a center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombus shape having each side inclined with respect to a direction. The pixels PX may be arranged in a stripe type or an island type. Each of the pixels PX may display a specific color by including one or more light emitting elements which emit light of a specific wavelength band.

The non-display area NDA may be disposed around (or adjacent to) the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
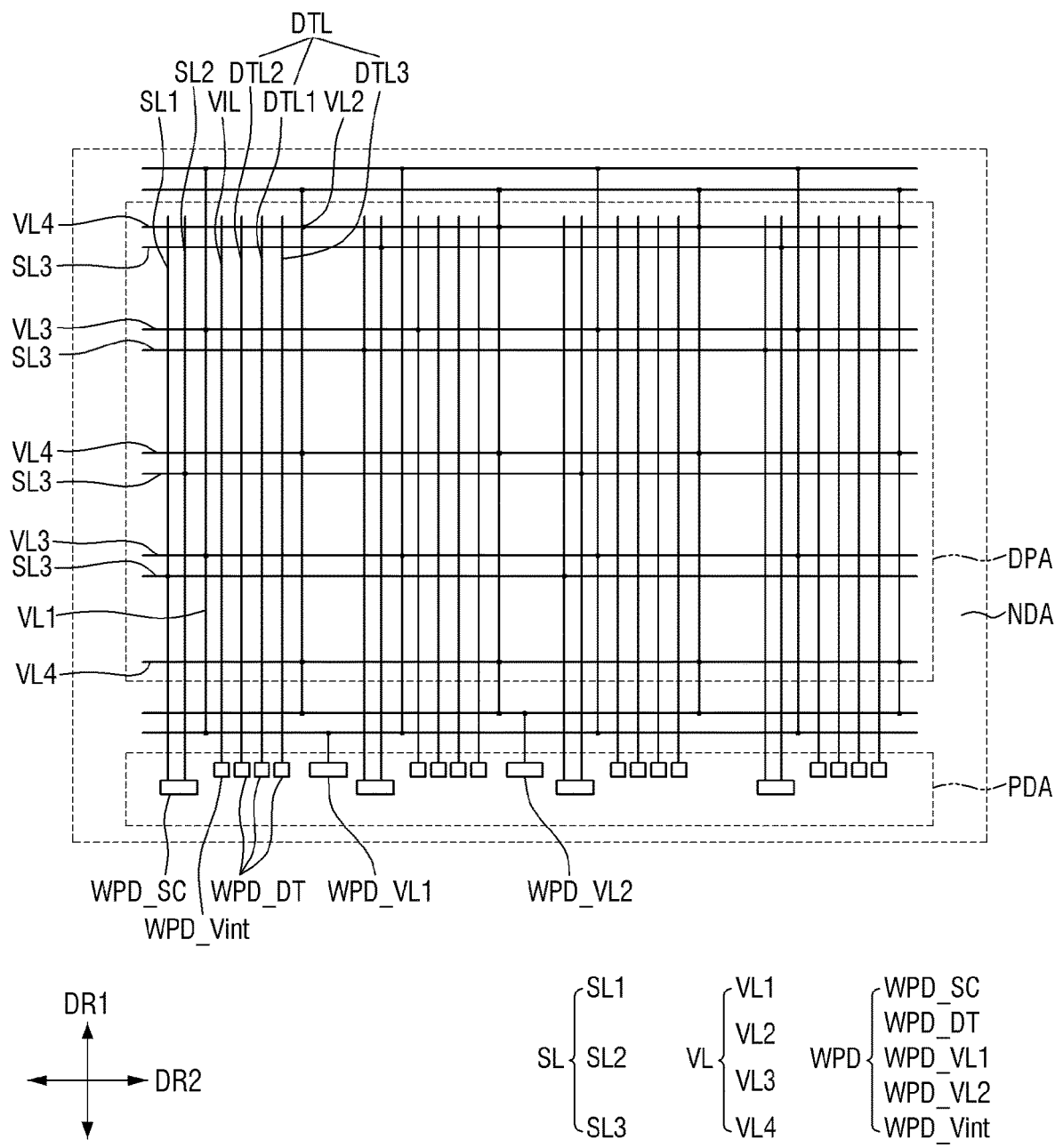
FIG. 2 is a schematic plan view illustrating the arrangement of wirings included in the display device according to the embodiment.

FIG. 2 is a schematic plan view illustrating the arrangement of wirings included in the display device 10 according to the embodiment.

Referring to FIG. 2, the display device 10 may include the wirings. The display device 10 may include scan lines SL (e.g., first to third scan lines SL1 to SL3), data lines DTL (e.g., first to third data lines DTL1 to DTL3), initialization voltage lines VIL, and voltage lines VL (e.g., first to fourth voltage lines VL1 to VL4). Although not illustrated in the drawing, other wirings may be further disposed in the display device 10.

First scan lines SL1 and second scan lines SL2 may extend in a first direction DR1. A first scan line SL1 and a second scan line SL2 in each pair may be disposed adjacent to each other and may be spaced apart from other first scan lines SL1 and other second scan lines SL2 in the second direction DR2. The first scan line SL1 and the second scan line SL2 in each pair may be electrically connected to a scan wiring pad WPD_SC electrically connected to a scan driver (not illustrated). The first scan lines SL1 and the second scan lines SL2 may extend from a pad area PDA disposed in the non-display area NDA to the display area DPA.

Third scan lines SL3 may extend in the second direction DR2, and each of the third scan lines SL3 may be spaced apart from other third scan lines SL3 in the first direction DR1. Each third scan line SL3 may be electrically connected to one or more first scan lines SL1 or one or more second scan lines SL2. In an embodiment, the first scan lines SL1 and the second scan lines SL2 may be formed of a conductive layer disposed on a different layer from the third scan lines SL3. The scan lines SL may have a mesh structure in the display area DPA (e.g., entire display area DPA), but the disclosure is not limited thereto.

The data lines DTL may extend in the first direction DR1. The data lines DTL may include first data lines DTL1, second data lines DTL2, and third data lines DTL3. One each of the first to third data line DTL3 may form a group, and may be disposed adjacent to each other. Each of the data lines DTL1 to DTL3 may extend from the pad area PDA disposed in the non-display area NDA to the display area DPA. However, the disclosure is not limited thereto, and the data lines DTL may be disposed at equal intervals between a first voltage line VL1 and a second voltage line VL2. Detailed description of the first voltage line VL1 and the second voltage line VL2 is provided below.

The initialization voltage lines VIL may extend in the first direction DR1. Each of the initialization voltage lines VIL may be disposed between the data lines DTL and the first and second scan lines SL1 and SL2. For example, each of the initialization voltage lines VIL may be disposed between one of the data lines DTL (e.g., first to third data lines DTL1 to DTL3) and one of the first and second scan lines SL1 and SL2, which are adjacent to each other. For example, each of the initialization voltage lines VIL may be disposed between the second data lines DTL2 and the second scan line SL2 in FIG. 2. The initialization voltage lines VIL may extend from the pad area PDA disposed in the non-display area NDA to the display area DPA.

First voltage lines VL1 and second voltage lines VL2 may extend in the first direction DR1, and third voltage lines VL3 and fourth voltage lines VL4 may extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may extend in the first direction DR1, and cross (or intersect) the display area DPA. Some voltage lines of the third voltage lines VL3 and the fourth voltage lines VL4 may be disposed in the display area DPA, and another voltage lines of the third voltage lines VL3 and the fourth voltage lines VL4 may be disposed in the non-display area NDA located on both sides of the display area DPA in the first direction DR1. The first voltage lines VL1 and the second voltage lines VL2 may be formed of a conductive layer disposed on a different layer from the third voltage lines VL3 and the fourth voltage lines VL4. Each of the first voltage lines VL1 may be electrically connected to at least one third voltage line VL3, and each of the second voltage lines VL2 may be electrically connected to at least one fourth voltage line VL4. The voltage lines VL may have a mesh structure in the display area DPA (e.g., entire display area DPA). However, the disclosure is not limited thereto.

The first scan lines SL1, the second scan lines SL2, the data lines DTL, the initialization voltage lines VIL, the first voltage lines VL1, and the second voltage lines VL2 may be electrically connected to at least one wiring pad WPD. Each wiring pad WPD may be disposed in the non-display area NDA. In an embodiment, each wiring pad WPD may be disposed in the pad area PDA located on a lower side of the display area DPA which is a second side in the first direction DR1. Each pair of the first and second scan lines SL1 and SL2 may be electrically connected to the scan wiring pad WPD_SC disposed in the pad area PDA, and the data lines DTL may be electrically connected to different data wiring pads WPD_DT. Each of the initialization voltage lines VIL may be electrically connected to an initialization wiring pad WPD_Vint. The first voltage lines VL1 may be electrically connected to a first voltage wiring pad WPD_VL1. The second voltage lines VL2 may be electrically connected to a second voltage wiring pad WPD_VL2. An external device may be mounted on the wiring pads WPD. The external device may be mounted on the wiring pads WPD through an anisotropic conductive film, ultrasonic bonding, or the like. Although each wiring pad WPD is disposed in the pad area PDA located on the lower side of the display area DPA in the drawing, the disclosure is not limited thereto. Some of the wiring pads WPD may also be disposed in an area located on an upper side or one of left and right sides of the display area DPA.

Each pixel PX or each subpixel SPXn (where n is an integer of 1 to 3) of the display device 10 may include a pixel driving circuit. The above-described wirings may transmit a driving signal to each pixel driving circuit while passing through or around each pixel PX. The pixel driving circuit may include a transistor and a capacitor. The number of transistors and capacitors in each pixel driving circuit may be variously changed. According to an embodiment, each subpixel SPXn of the display device 10 may have a 3T1C structure in which the pixel driving circuit includes three transistors and a capacitor. Although the pixel driving circuit described below has the 3T1C structure as an example, the disclosure is not limited thereto, and other various modified pixel structures such as a 2T1C structure, a 7T1C structure, and a 6T1C structure are also applicable. For example, the 2T1C structure includes two transistors and a capacitor in each pixel driving circuit. The 7T1C structure includes seven transistors and a capacitor in each pixel driving circuit. The 6T1C structure includes six transistors and a capacitor in each pixel driving circuit.

Figure 3:
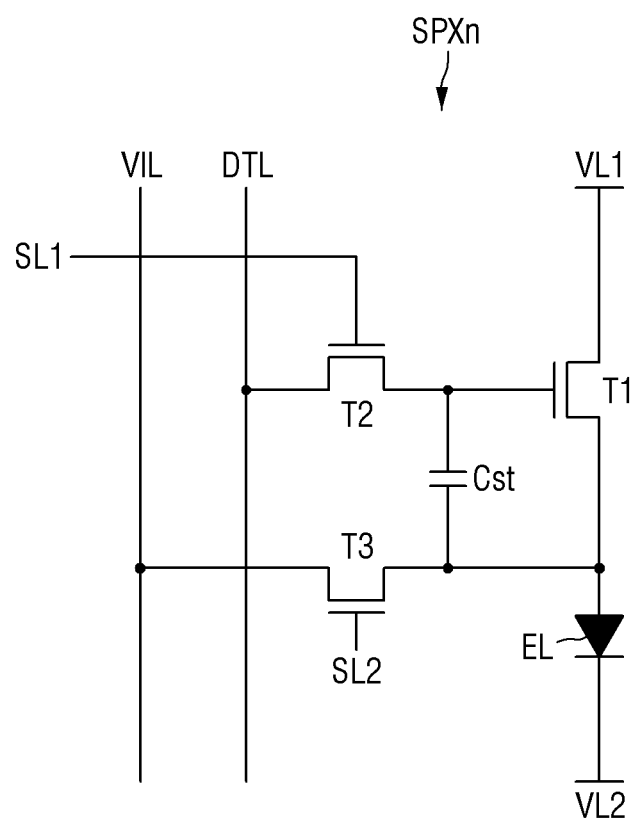
FIG. 3 is a schematic diagram of an equivalent circuit of a subpixel of the display device according to the embodiment.

FIG. 3 is a schematic diagram of an equivalent circuit of a subpixel according to an embodiment.

Referring to FIG. 3, each subpixel SPXn of the display device 10 according to the embodiment may include three transistors T1 to T3, a storage capacitor Cst, and a light emitting diode EL.

The light emitting diode EL may emit light according to a current supplied through a first transistor T1. The light emitting diode EL may include a first electrode, a second electrode, and at least one light emitting element disposed between the first and second electrodes. The light emitting element may emit light of a wavelength band in response to electrical signals received from the first electrode and the second electrode.

A first end of the light emitting diode EL may be electrically connected to a source electrode of the first transistor T1, and a second end of the light emitting diode EL may be electrically connected to a second voltage line VL2 to which a low potential voltage (hereinafter, referred to as a second power supply voltage) lower than a high potential voltage (hereinafter, referred to as a first power supply voltage) of a first voltage line VL1 is supplied.

The first transistor T1 may adjust (or control) a current flowing from the first voltage line VL1, to which the first power supply voltage is supplied, to the light emitting diode EL according to a voltage difference between a gate electrode and the source electrode thereof. For example, the first transistor T1 may be a driving transistor for driving the light emitting diode EL. The first transistor T1 may have the gate electrode electrically connected to a source electrode of a second transistor T2, the source electrode electrically connected to the first electrode of the light emitting diode EL, and a drain electrode electrically connected to the first voltage line VL1 to which the first power supply voltage is applied.

The second transistor T2 may be turned on by a scan signal of a first scan line SL1 to electrically connect a data line DTL to the gate electrode of the first transistor T1. The second transistor T2 may have a gate electrode electrically connected to the first scan line SL1, the source electrode electrically connected to the gate electrode of the first transistor T1, and a drain electrode electrically connected to the data line DTL.

A third transistor T3 may be turned on by a scan signal of a second scan line SL2 to electrically connect an initialization voltage line VIL to the first end of the light emitting diode EL. The third transistor T3 may have a gate electrode electrically connected to the second scan line SL2, a drain electrode electrically connected to the initialization voltage line VIL, and a source electrode electrically connected to the first end of the light emitting diode EL and the source electrode of the first transistor T1.

Although the gate electrodes of the second transistor T2 and the third transistor T3 are electrically connected to different scan lines SL1 and SL2 in the drawing, the disclosure is not limited thereto. In some embodiments, the gate electrodes of the second transistor T2 and the third transistor T3 may be electrically connected to a same scan line.

In an embodiment, the source electrode and the drain electrode of each of the transistors T1 to T3 may not be limited to the above description, and the transistors T1 to T3 may have opposite structures to those shown in FIG. 3. Each of the transistors T1 to T3 may be formed as a thin-film transistor. Although each of the transistors T1 to T3 is mainly described as an N-type metal oxide semiconductor field effect transistor (MOSFET) in FIG. 3, the disclosure is not limited thereto. Each of the transistors T1 to T3 may also be formed as a P-type MOSFET. In other embodiments, some of the transistors T1 to T3 may be formed as N-type MOSFETs, and the other may be formed as a P-type MOSFET.

The storage capacitor Cst may be formed between the gate electrode and the source electrode of the first transistor T1. The storage capacitor Cst may store a difference (e.g., voltage difference) between a gate voltage and a source voltage of the first transistor T1.

Description of the structure of a pixel PX of the display device 10 according to the embodiment is provided in detail with further reference to other drawings.

Figure 4:
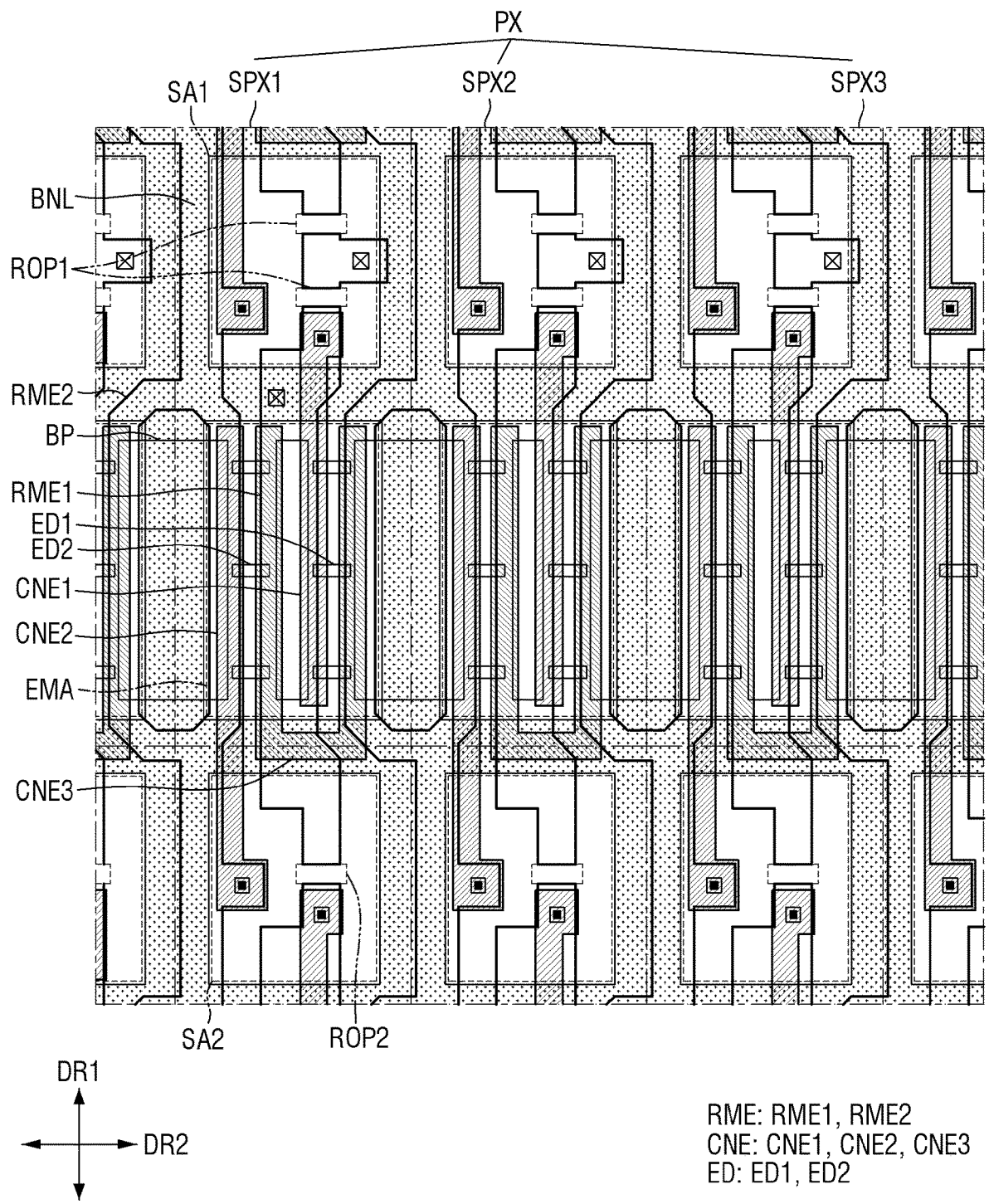
FIG. 4 is a schematic plan view of a pixel of the display device according to the embodiment.

FIG. 4 is a schematic plan view of a pixel PX of the display device 10 according to the embodiment. FIG. 4 illustrates the planar arrangement of electrodes RME (e.g., first and second electrodes RME1 and RME2), bank patterns BP1 and BP2, a bank layer BNL, light emitting elements ED (e.g., first and second light emitting electrodes ED1 and ED2), and connection electrodes CNE (e.g., first to third connection electrodes CNE1 to CNE3) disposed in the pixel PX of the display device 10.

Referring to FIG. 4, each of the pixels PX of the display device 10 may include subpixels SPXn. For example, the pixel PX may include a first subpixel SPX1, a second subpixel SPX2, and a third subpixel SPX3. The first subpixel SPX1 may emit light of a first color. The second subpixel SPX2 may emit light of a second color. The third subpixel SPX3 may emit light of a third color. For example, the first color may be blue, the second color may be green, and the third color may be red. However, the disclosure is not limited thereto, and the subpixels SPXn may also emit light of a same color. In an embodiment, the subpixels SPXn may emit blue light. Although each pixel PX includes three subpixels SPXn in the drawing, the disclosure is not limited thereto, and the pixel PX may also include a greater number (e.g., four or more) of subpixels SPXn.

Each subpixel SPXn of the display device 10 may include an emission area EMA and a non-emission area. The emission area EMA may be an area in which the light emitting elements ED are disposed to emit light of a wavelength band. The non-emission area may be an area in which the light emitting elements ED are not disposed and from which no light is output because light emitted from the light emitting elements ED does not reach the non-emission area.

The emission area EMA may include an area in which the light emitting elements ED are disposed and an area which is adjacent to the light emitting elements ED and from which the light emitted from the light emitting elements ED is output. For example, the emission area EMA may also include an area from which light emitted from the light emitting elements ED is output after being reflected or refracted by other members. Multiple light emitting elements ED may be disposed in each subpixel SPXn, and an area where the light emitting elements ED are disposed and an area adjacent to this area may form the emission area EMA.

Although the respective emission areas EMA of the subpixels SPXn have substantially a same area in the drawing, the disclosure is not limited thereto. In some embodiments, the emission area EMA of each subpixel SPXn may have a different area according to the color or wavelength band of light emitted from the light emitting elements ED disposed in the subpixel SPXn.

Each subpixel SPXn may further include sub-areas SA1 and SA2 disposed in the non-emission area. A first sub-area SA1 of a corresponding subpixel SPXn may be disposed on an upper side of the emission area EMA which is a first side in the first direction DR1, and a second sub-area SA2 may be disposed on a lower side of the emission area EMA which is the second side in the first direction DR1. The emission area EMA and the sub-areas SA1 and SA2 may be alternately arranged in the first direction DR1, and the first sub-area SA1 or the second sub-area SA2 may be disposed between the emission areas EMA of different subpixels SPXn spaced apart from each other in the first direction DR1. For example, the emission area EMA and the sub-areas SA1 and SA2 may be alternately arranged in the first direction DR1 and may each be repeatedly arranged in the second direction DR2. However, the disclosure is not limited thereto, and the arrangement of the emission areas EMA and the sub-areas SA in pixels PX may also be different from that in FIG. 4.

Light (e.g., light generated by light emitting elements LD) may not exit from the sub-areas SA1 and SA2 because the light emitting elements ED are not disposed in the sub-areas SA1 and SA2. However, parts of the electrodes RME disposed in each subpixel SPXn may be disposed in the sub-areas SA1 and SA2. The electrodes RME disposed in different subpixels SPXn may be separated from each other by separation parts ROP1 and ROP2 of the sub-areas SA1 and SA2.

Wirings and circuit elements of a circuit layer disposed in each pixel PX and electrically connected to the light emitting diodes EL may be electrically connected to each of the first to third subpixels SPX1 to SPX3. However, the wirings and the circuit elements may not be disposed to correspond to an area occupied by each subpixel SPXn or each emission area EMA but may be disposed regardless of the positions of the emission areas EMA in a pixel PX.

The bank layer BNL may surround the subpixels SPXn, the emission areas EMA, and the sub-areas SA1 and SA2. The bank layer BNL may be disposed at boundaries between the subpixels SPXn adjacent to each other in the first direction DR1 and the second direction DR2 and also may be disposed at boundaries between the emission areas EMA and the sub-areas SA1 and SA2. The subpixels SPXn, the emission areas EMA, and the sub-areas SA1 and SA2 of the display device 10 may be areas separated by the arrangement of the bank layer BNL. Distances between the subpixels SPXn, the emission areas EMA, and the sub-areas SA1 and SA2 may vary according to a width of the bank layer BNL.

The bank layer BNL may include parts extending in the first direction DR1 and the second direction DR2 in a plan view to form a grid pattern in the display area DPA (e.g., entire display area DPA of FIG. 2). The bank layer BNL may be disposed at the boundary of each subpixel SPXn to separate adjacent subpixels SPXn. The bank layer BNL may surround the emission area EMA and the sub-areas SA1 and SA2 disposed in each subpixel SPXn to separate the emission area EMA and the sub-areas SA1 and SA2 from each other.

Figure 5:
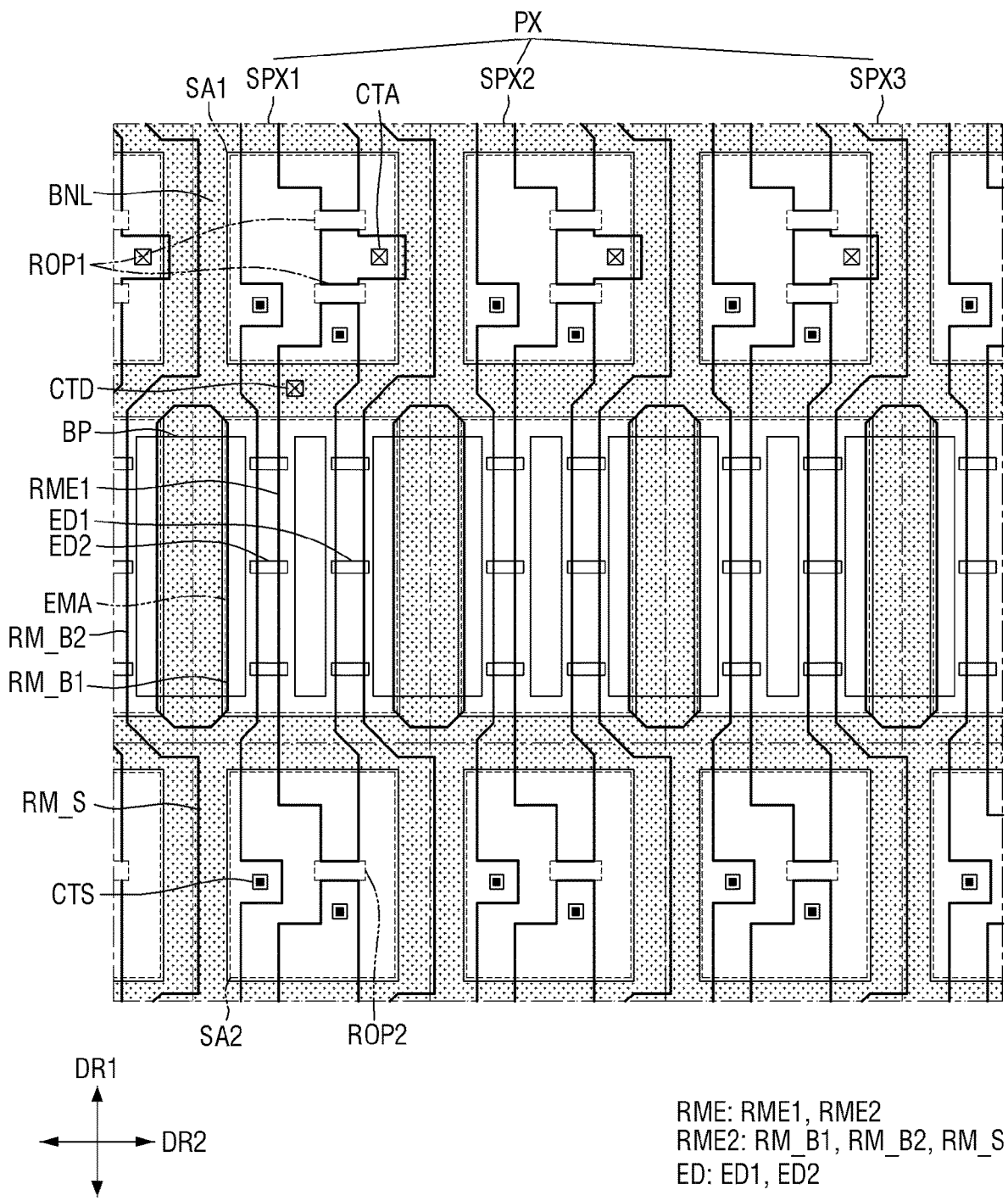
FIG. 5 is a schematic plan view illustrating the arrangement of electrodes included in the pixel of FIG. 4.
Figure 6:
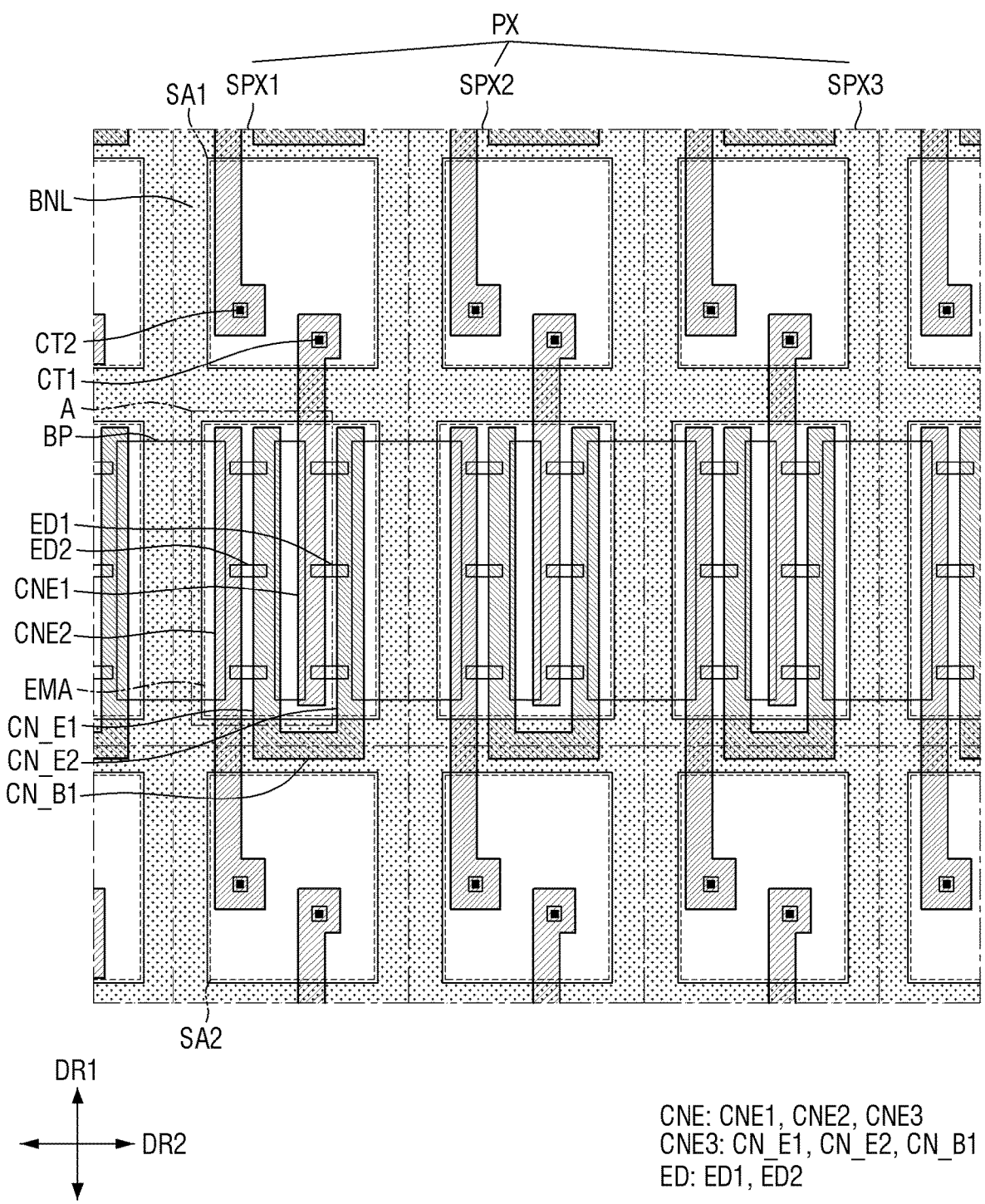
FIG. 6 is a schematic plan view illustrating the arrangement of connection electrodes included in the pixel of FIG. 4.
Figure 7:
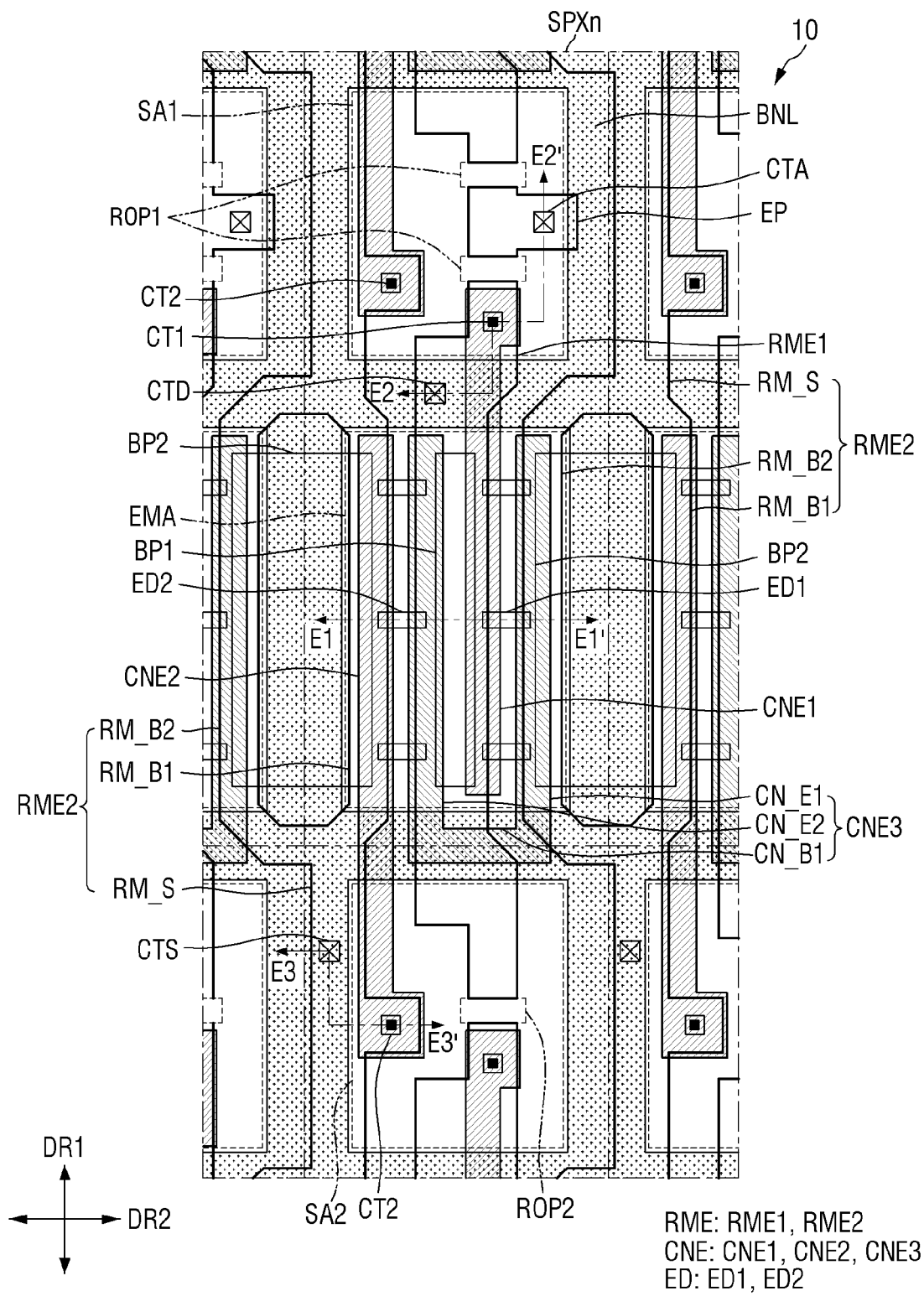
FIG. 7 is a schematic plan view of a subpixel of FIG. 4.
Figure 8:
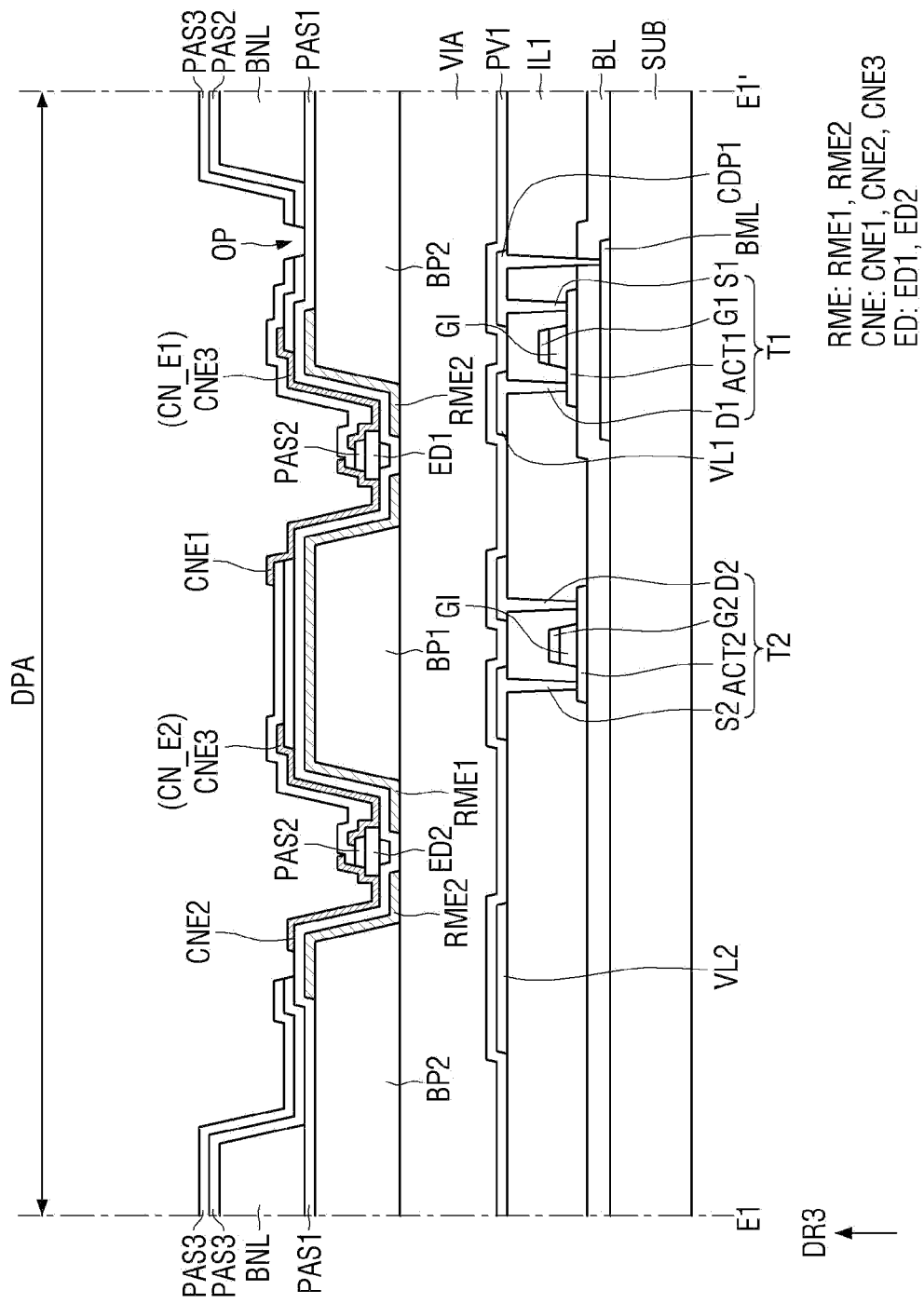
FIG. 8 is a schematic cross-sectional view taken along line E1-E1' of FIG. 7.
Figure 9:
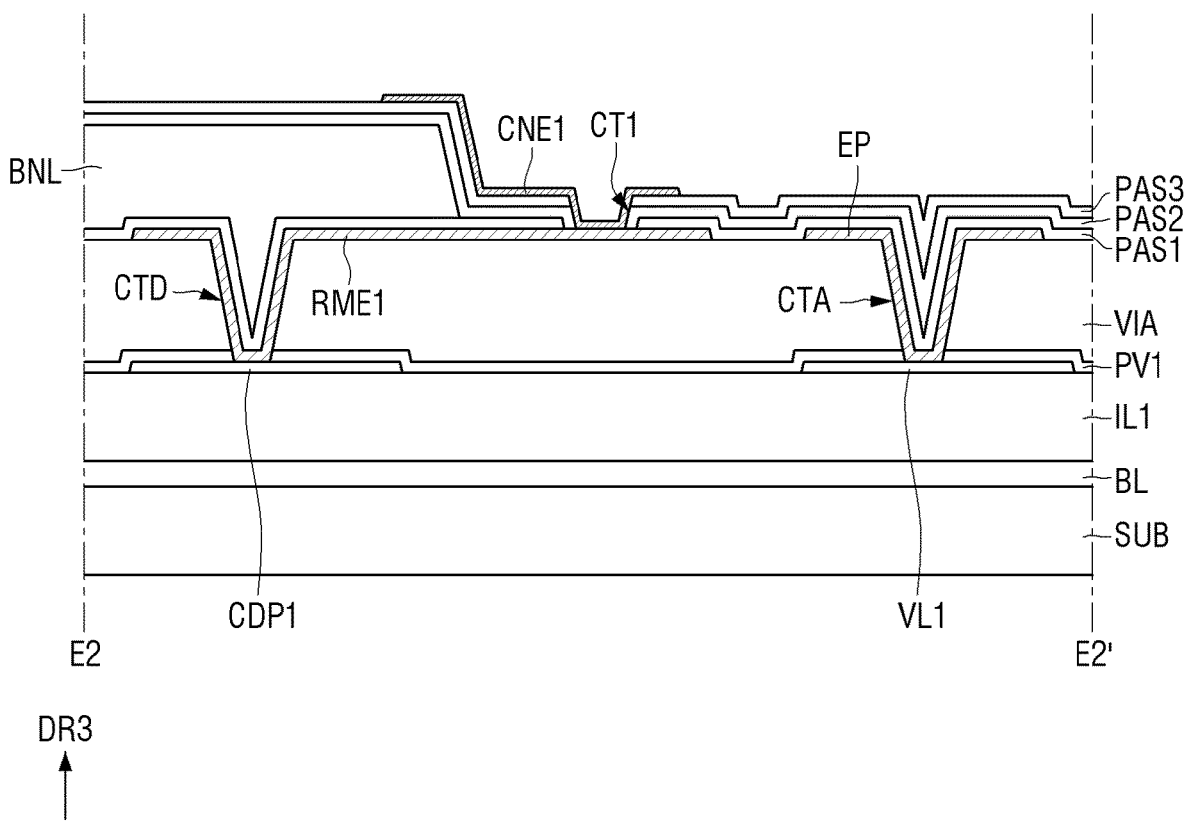
FIG. 9 is a schematic cross-sectional view taken along line E2-E2' of FIG. 7.
Figure 10:
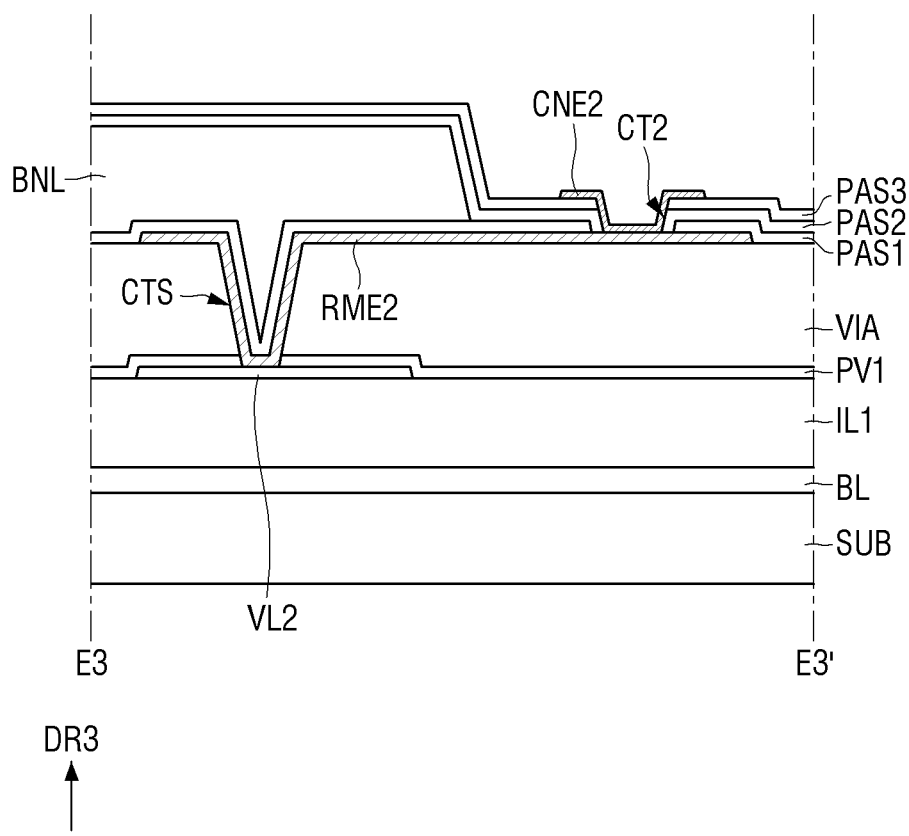
FIG. 10 is a schematic cross-sectional view taken along line E3-E3' of FIG. 7.

FIG. 5 is a schematic plan view illustrating the arrangement of the electrodes RME included in the pixel PX of FIG. 4. FIG. 6 is a plan view illustrating the arrangement of the connection electrodes CNE included in the pixel PX of FIG. 4. FIG. 7 is a schematic plan view of a subpixel SPXn of FIG. 4. FIG. 8 is a schematic cross-sectional view taken along line E1-E1' of FIG. 7. FIG. 9 is a schematic cross-sectional view taken along line E2-E2' of FIG. 7. FIG. 10 is a schematic cross-sectional view taken along line E3-E3' of FIG. 7.

FIGS. 5 and 6 are plan views illustrating relative arrangements of the electrodes RME and the connection electrodes CNE disposed in a pixel PX, respectively. FIG. 8 illustrates a cross section across both ends of light emitting elements ED1 and ED2 disposed in a subpixel SPXn. FIGS. 9 and 10 respectively illustrate cross sections across electrode contact holes CTD, CTS and CTA and contact parts CT1 and CT2 disposed in the subpixel SPXn.

Referring to FIGS. 5 to 10 in conjunction with FIG. 4, the display device 10 may include a first substrate SUB, a semiconductor layer, conductive layers, and insulating layers. The first substrate SUB, the semiconductor layer, the conductive layers, and the insulating layers may be disposed on the first substrate SUB. The display device 10 may include the electrodes RME (e.g., first and second electrodes RME1 and RME2), the light emitting elements ED (e.g., first and second light emitting electrodes ED1 and ED2), and the connection electrodes CNE (e.g., first to third connection electrodes CNE1 to CNE3). The semiconductor layer, the conductive layers, and the insulating layers may constitute a circuit layer of the display device 10.

The first substrate SUB may be an insulating substrate. The first substrate SUB may be made of an insulating material such as glass, quartz, or polymer resin. The first substrate SUB may be a rigid substrate, but may also be a flexible substrate that may be bent, folded, rolled, or the like. The first substrate SUB may include the display area DPA (e.g., refer to FIG. 2) and the non-display area NDA (e.g., refer to FIG. 2) surrounding the display area DPA, and the display area DPA may include the emission area EMA and the sub-areas SA1 and SA2 which are part of the non-emission area.

A first conductive layer may be disposed on the first substrate SUB. The first conductive layer may include a bottom metal layer BML, and an active layer ACT1 of a first transistor T1 may overlap the bottom metal layer BML in a plan view. The bottom metal layer BML may prevent light from entering the first active layer ACT1 of the first transistor T1. In an embodiment, the bottom metal layer BML may be electrically connected to the first active layer ACT1 to stabilize electrical characteristics of the first transistor T1. However, the bottom metal layer BML may also be omitted.

A buffer layer BL may be disposed on the bottom metal layer BML and the first substrate SUB. The buffer layer BL may be formed on the first substrate SUB to protect transistors of the pixel PX, which are vulnerable to moisture penetration, from moisture introduced through the first substrate SUB. The buffer layer BL may perform a surface planarization function.

The semiconductor layer may be disposed on the buffer layer BL. The semiconductor layer may include the first active layer ACT1 of the first transistor T1 and a second active layer ACT2 of a second transistor T2. A first gate electrode G1 and a second gate electrode G2 of a second conductive layer may overlap (e.g., partially overlap) the first active layer ACT1 and the second active layer ACT2 in a plan view. Description of the first gate electrode G1 and the second gate electrode G2 of the second conductive layer is provided below.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be (or include) at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel SPXn of the display device 10 in the drawings, the disclosure is not limited thereto, and the display device 10 may include a greater number of transistors.

A first gate insulating layer GI may be disposed on the semiconductor layer in the display area DPA (e.g., refer to FIG. 2). The first gate insulating layer GI may not be disposed in the pad area PDA (e.g., refer to FIG. 2). The first gate insulating layer GI may serve as a gate insulating film of each of the transistors T1 and T2. In the drawings, the first gate insulating layer GI may be patterned together with the gate electrodes G1 and G2 of the second conductive layer. Description of the second conductive layer is provided below. Thus, the first gate insulating layer GI may be disposed partially between the second conductive layer and the active layers ACT1 and ACT2 of the semiconductor layer. However, the disclosure is not limited thereto. In some embodiments, the first gate insulating layer GI may be disposed (e.g., entirely disposed) on the buffer layer BL.

The second conductive layer may be disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is a thickness direction of the display device 10, and the second gate electrode G2 may overlap a channel region of the second active layer ACT2 in the third direction DR3 which is the thickness direction. Although not illustrated in the drawings, the second conductive layer may further include a first electrode of a storage capacitor.

A first interlayer insulating layer IL1 may be disposed on the second conductive layer. The first interlayer insulating layer IL1 may function as an insulating film between the second conductive layer and other layers disposed on the second conductive layer. The first interlayer insulating layer IL1 may protect the second conductive layer.

A third conductive layer may be disposed on the first interlayer insulating layer ILL The third conductive layer may include a first voltage line VL1 and a second voltage line VL2 disposed in the display area DPA, a first conductive pattern CDP1, and a source electrode S1 or S2 and a drain electrode D1 or D2 of each of the transistors T1 and T2. Although not illustrated in the drawings, the third conductive layer may further include a second electrode of the storage capacitor.

A high potential voltage (or first power supply voltage) supplied to a first electrode RME1 may be applied to the first voltage line VL1, and a low potential voltage (or second power supply voltage) supplied to a second electrode RME2 may be applied to the second voltage line VL2. A part of the first voltage line VL1 may contact (or be electrically connected to) the first active layer ACT1 of the first transistor T1 through a contact hole penetrating the first interlayer insulating layer IL1 and the first gate insulating layer GI. The first voltage line VL1 may serve as a first drain electrode D1 of the first transistor T1. The second voltage line VL2 may be electrically connected (e.g., directly connected) to the second electrode RME2. Description of the second electrode RME2 is provided below.

The first conductive pattern CDP1 may contact the first active layer ACT1 of the first transistor T1 through a contact hole penetrating the first interlayer insulating layer IL1 and the first gate insulating layer GI. The first conductive pattern CDP1 may contact the bottom metal layer BML through another contact hole penetrating the first interlayer insulating layer IL1 and the buffer layer BL. The first conductive pattern CDP1 may serve as a first source electrode S1 of the first transistor T1. The first conductive pattern CDP1 may be electrically connected to the first electrode RME1 or a first connection electrode CNE1 to be described later. The first transistor T1 may transmit the first power supply voltage received from the first voltage line VL1 to the first electrode RME1 or the first connection electrode CNE1.

Each of a second source electrode S2 and a second drain electrode D2 may contact the second active layer ACT2 of the second transistor T2 through a contact hole penetrating the first interlayer insulating layer IL1 and the first gate insulating layer GI. The second transistor T2 may be any of the switching transistors described above with reference to FIG. 3. The second transistor T2 may transmit a signal received from the data line DTL of FIG. 3 to the first transistor T1 or transmit a signal received from the initialization voltage line VIL of FIG. 3 to the second electrode of the storage capacitor.

A first passivation layer PV1 may be disposed on the third conductive layer. The first passivation layer PV1 may function as an insulating film between the third conductive layer and other layers (e.g., electrodes RME, connection electrodes CNE, or the like). The first passivation layer PV1 may protect the third conductive layer.

Each of the buffer layer BL, the first gate insulating layer GI, the first interlayer insulating layer ILL and the first passivation layer PV1 described above may be composed of inorganic layers alternately stacked. For example, each of the buffer layer BL, the first gate insulating layer GI, the first interlayer insulating layer ILL and the first passivation layer PV1 may be (or include) a double layer in which inorganic layers including at least one of silicon oxide ($SiO_x$), silicon nitride ($SiN_x$) and silicon oxynitride ($SiO_xN_y$) are stacked or may be a multi-layer in which the above materials are alternately stacked. However, the disclosure is not limited thereto, and each of the buffer layer BL, the first gate insulating layer GI, the first interlayer insulating layer IL1, and the first passivation layer PV1 may also be composed of one inorganic layer including any of the above insulating materials. In some embodiments, the first interlayer insulating layer IL1 may be made of an organic insulating material such as polyimide (PI).

A via layer VIA may be disposed on the third conductive layer in the display area DPA (e.g., refer to FIG. 2). The via layer VIA may include an organic insulating material such as polyimide (PI), and compensate for a step difference (height difference) due to the conductive layers thereunder and may form a flat upper surface. However, in some embodiments, the via layer VIA may be omitted.

The display device 10 may include, as a display element layer disposed on the via layer VIA, the bank patterns BP1 and BP2, the electrodes RME (e.g., first and second electrodes RME1 and RME2), the bank layer BNL, the light emitting elements ED, and the connection electrodes CNE (e.g., first to third connection electrodes CNE1 to CNE3), which are disposed on the via layer VIA. The display device 10 may include insulating layers PAS1 to PAS3 disposed on the via layer VIA.

The bank patterns BP1 and BP2 may be disposed in the emission area EMA of each subpixel SPXn. Each of the bank patterns BP1 and BP2 may have a width in the second direction DR2 and may extend in the first direction DR1. In an embodiment, the bank patterns BP1 and BP2 may extend in the first direction DR1 and have different widths measured in the second direction DR2, and any of the bank patterns BP1 and BP2 may be disposed over subpixels SPXn neighboring (or adjacent to) each other in the second direction DR2.

For example, the bank patterns BP1 and BP2 may include a first bank pattern BP1 disposed in the emission area EMA of each subpixel SPXn and a second bank pattern BP2 disposed over the emission areas EMA of different subpixels SPXn. For example, the second bank pattern BP2 may be disposed over the emission areas EMA of multiple subpixels SPXn adjacent to each other.

The first bank pattern BP1 may be disposed in the center of the emission area EMA. The second bank patterns BP2 may be spaced apart from each other, and the first bank pattern BP1 may be interposed between adjacent second bank patterns BP2. The first bank pattern BP1 and the second bank pattern BP2 may be alternately disposed in the second direction DR2. The light emitting elements ED may be disposed between the first bank pattern BP1 and the second bank pattern BP2 spaced apart from each other.

The first bank pattern BP1 and the second bank pattern BP2 may have a same length in the first direction DR1, and may have different widths measured in the second direction DR2. A part of the bank layer BNL which extends in the first direction DR1 may overlap the second bank pattern BP2 in the thickness direction. The first bank pattern BP1 may overlap the first electrode RME1, and the second bank pattern BP2 may overlap electrode branch parts RM_B1 and RM_B2 of the second electrode RME2 and the bank layer BNL in a plan view. The bank patterns BP1 and BP2 may be disposed as island-shaped patterns in the display area DPA (e.g., entire display area DPA).

Although the bank patterns BP1 and BP2 having different widths are disposed in each subpixel SPXn in the drawings, the disclosure is not limited thereto. The number and shape of the bank patterns BP1 and BP2 may vary according to the number or arrangement structure of the electrodes RME.

The first bank pattern BP1 and the second bank pattern BP2 in the first direction DR1 may have a same length. The length of the first bank pattern BP1 and the second bank pattern BP2 may be greater than a length, in the first direction DR1, of the emission area EMA surrounded by the bank layer BNL. The first bank pattern BP1 and the second bank pattern BP2 may overlap (e.g., partially overlap) parts of the bank layer BNL in a plan view which extend in the second direction DR2. However, the disclosure is not limited thereto, and the bank patterns BP1 and BP2 may also be integrated with the bank layer BNL or may be spaced apart from the parts of the bank layer BNL which extend in the second direction DR2. The length of each of the bank patterns BP1 and BP2 in the first direction DR2 may be equal to or smaller than the length, in the first direction DR1, of the emission area EMA surrounded by the bank layer BNL The bank patterns BP1 and BP2 may be disposed on the via layer VIA. For example, the bank patterns BP1 and BP2 may be disposed (e.g., directly disposed) on the via layer VIA, and at least a part of each of the bank patterns BP1 and BP2 may protrude from an upper surface of the via layer VIA. The protruding part of each of the bank patterns BP1 and BP2 may have side surfaces inclined or curved with a curvature, and light emitted from the light emitting elements ED may be reflected upward above the via layer VIA by the electrodes RME disposed on the bank patterns BP1 and BP2. Although not shown in the drawings, each of the bank patterns BP1 and BP2 may also have an outer surface curved with a curvature in cross section. For example, each of the bank patterns BP1 and BP2 may have a semicircular or semielliptical shape. The bank patterns BP1 and BP2 may include, but are not limited to, an organic insulating material such as polyimide (PI).

The electrodes RME (e.g., first and second electrodes RME1 and RME2) may extend in a direction (e.g., first direction DR1) and may be disposed in each subpixel SPXn. The electrodes RME1 and RME2 may extend in the first direction DR1, and may be disposed in the emission area EMA and the sub-areas SA1 and SA2 of each subpixel SPXn. The electrodes RME1 and RME2 may be spaced apart from each other in the second direction DR2. The electrodes RME may be electrically connected to the light emitting elements ED, but the present disclosure is not limited thereto. Description of the light emitting elements ED is provided below. In other embodiments, the electrodes RME may not be electrically connected to the light emitting elements ED.

The electrodes RME may include the first electrode RME1 and the second electrode RME2. The first electrode RME1 may be disposed in the center of each subpixel SPXn. The second electrode RME2 may be disposed over different subpixels SPXn. The first electrode RME1 and the second electrode RME2 may extend in the first direction DR1. For example, parts of the first electrode RME1 and the second electrode RME2 which are disposed in the emission area EMA may have different shapes from each other.

The first electrode RME1 may be disposed in the center of each subpixel SPXn, and a part of the first electrode RME1 disposed in the emission area EMA may be disposed on the first bank pattern BP1. The first electrode RME1 may extend in the first direction DR1 from the first sub-area SA1 to the second sub-area SA2. A width of the first electrode RME1 measured in the second direction DR2 may vary according to a position thereof, and at least a part of the first electrode RME1 overlapping the first bank pattern BP1 in the emission area EMA may have a greater width than the first bank pattern BP1 in a plan view.

The second electrode RME2 may include a part extending in the first direction DR1 and parts branching in the vicinity of the emission area EMA. In an embodiment, the second electrode RME2 may include an electrode stem part RM_S extending in the first direction DR1 and electrode branch parts RM_B1 and RM_B2 branching from the electrode stem part RM_S, bending in the second direction DR2, and then extending again in the first direction DR1. The electrode stem part RM_S may overlap a part of the bank layer BNL in a plan view which extends in the first direction DR1 and may be disposed on a side of each sub-area SA1 or SA2 in the second direction DR2. The electrode branch parts RM_B1 and RM_B2 may branch from the electrode stem part RM_S disposed in a part of the bank layer BNL which extends in the first direction DR1 and may be bent to both sides in the second direction DR2. The electrode stem part RM_S may be separated into the electrode branch parts RM_B1 and RM_B2 at a part where a part of the bank layer BNL which extends in the first direction DR1 and a part of the bank layer BNL which extends in the second direction DR2 intersect each other. For example, the electrode branch parts RM_B1 and RM_B2 may be branched from the electrode stem part RM_S at which the parts of the bank layer BNL extending in the first and second directions DR1 and DR2 intersect each other. The electrode branch parts RM_B1 and RM_B2 may extend across the emission area EMA in the first direction DR1 and may be bent again to be electrically connected to the electrode stem part RM_S. For example, the electrode branch parts RM_B1 and RM_B2 of the second electrode RME2 may branch on the upper side of the emission area EMA of any subpixel SPXn and may be electrically connected to each other again on the lower side of the emission area EMA.

The second electrode RME2 may include a first electrode branch part RM_B1 disposed on a left side of the first electrode RME1 and a second electrode branch part RM_B2 disposed on a right side of the first electrode RME1. The electrode branch parts RM_B1 and RM_B2 included in a second electrode RME2 may be respectively disposed in the emission areas EMA of subpixels SPXn neighboring (or adjacent to) each other in the second direction DR2, and the electrode branch parts RM_B1 and RM_B2 of different second electrodes RME2 may be disposed in a subpixel SPXn. The first electrode branch part RM_B1 of a second electrode RME2 may be disposed on the left side of the first electrode RME1, and the second electrode branch part RM_B2 of another second electrode RME2 may be disposed on the right side of the first electrode RME1.

Each of the electrode branch parts RM_B1 and RM_B2 of the second electrode RME2 may overlap a side of the second bank pattern BP2 in a plan view. The first electrode branch part RM_B1 may overlap (e.g., partially overlap) the second bank pattern BP2 disposed on a left side of the first bank pattern BP1, and the second electrode branch part RM_B2 may overlap (e.g., partially overlap) the second bank pattern BP2 disposed on a right side of the first bank pattern BP1 in a plan view. Both sides of the first electrode RME1 may be spaced apart from different electrode branch parts RM_B1 and RM_B2 of different second electrodes RME2, and may face the electrode branch parts RM_B1 and RM_B2. For example, the both sides of the first electrode RME1 may be spaced apart from the first branch part RM_B1 of the second electrode RME2 and another second branch part RM_B2 of adjacent second electrode RME2, and face the first branch part RM_B1 of the second electrode RME2 and the another second branch part RM_B2 of the adjacent second electrode RME2. A distance between the first electrode RME1 and each of the electrode branch parts RM_B1 and RM_B2 may be smaller than a distance between the bank patterns BP1 and BP2.

The width of the first electrode RME1 measured in the second direction DR2 may be greater than widths of the electrode stem part RM_S and the electrode branch parts RM_B1 and RM_B2 of the second electrode RME2. The first electrode RME1 may have a greater width than the first bank pattern BP1, and overlap both sides of the first bank pattern BP1 in a plan view. On the other hand, the second electrode RME2 may have a relatively small width so that each of the electrode branch parts RM_B1 and RM_B2 overlaps only one side of the second bank pattern BP2 in a plan view.

The light emitting elements ED disposed between the bank patterns BP1 and BP2 may emit light toward both ends thereof, and the emitted light may travel toward the electrodes RME disposed on the bank patterns BP1 and BP2. Each electrode RME may have a structure in which a part disposed on a bank pattern BP1 or BP2 can reflect light emitted from the light emitting elements ED. Each of the first electrode RME1 and the second electrode RME2 may cover at least one side surface of the bank pattern BP1 or BP2 to reflect light emitted from the light emitting elements ED.

The first electrode RME1 among the first electrode RME1 and the second electrode RME2 may extend up to a first separation part ROP1 of the first sub-area SA1 and a second separation part ROP2 of the second sub-area SA2. However, the second electrode RME2 may not be separated in the sub-areas SA1 and SA2. In an embodiment, each second electrode RME2 may include electrode stem parts RM_S and electrode branch parts RM_B1 and RM_B2 to extend in the first direction DR1 and may branch in the vicinity of the emission area EMA of each subpixel SPXn. The first electrode RME1 may be disposed between the separation parts ROP1 and ROP2 disposed in different sub-areas SA1 and SA2 of each subpixel SPXn and may be disposed across the emission area EMA.

According to an embodiment, the display device 10 may include a wiring connection electrode EP disposed in the first sub-area SA1 among the sub-areas SA1 and SA2 and disposed between the first electrodes RME1 of different subpixels SPXn (e.g., adjacent subpixels SPXn). In the second sub-area SA2 of each subpixel SPXn, the wiring connection electrode EP may not be disposed, and the first electrodes RME1 of different subpixels SPXn adjacent to each other in the first direction DR1 may be spaced apart from each other. In the subpixel SPXn illustrated in FIG. 7 among subpixels SPXn, the first sub-area SA1 in which the wiring connection electrode EP is disposed may be disposed above the emission area EMA, and the second sub-area SA2 may be disposed below the emission area EMA. On the other hand, in a subpixel SPXn adjacent to the subpixel SPXn of FIG. 7 in the first direction DR1, the first sub-area SA1 in which the wiring connection electrode EP is disposed may be disposed below the emission area EMA, and the second sub-area SA2 may be disposed above the emission area EMA.

The first electrode RME1 may be spaced apart from the wiring connection electrode EP, and the first separation part ROP1 may be disposed (or interposed) between the first electrode RME1 and the wiring connection electrode EP in the first sub-area SA1. In each first sub-area SA1, two first separation parts ROP1 may be disposed. The wiring connection electrode EP may be spaced apart from the first electrode RME1 disposed in a corresponding subpixel SPXn, and a lower first separation part ROP1 may be interposed between the wiring connection electrode EP and the first electrode RME1. The wiring connection electrode EP may be spaced apart from the first electrode RME1 disposed in another subpixel SPXn, and an upper first separation part ROP may be interposed between the wiring connection electrode EP and the first electrode RME1 disposed in the another subpixel SPX1. In the second sub-area SA2, a second separation part ROP2 may be disposed, and different first electrodes RME1 may be spaced apart from each other in the first direction DR1.

In an embodiment, the first electrode RME1 may contact the first conductive pattern CDP1 of the third conductive layer through a first electrode contact hole CTD in a part of the first electrode RME1 overlapping a part of the bank layer BNL in a plan view which extends in the second direction DR2. For example, the first electrode RME1 may contact the first conductive pattern CDP1 of the third conductive layer through the first electrode contact hole CTD, and the first electrode contact hole CTD is disposed under the bank layer BNL overlapping the first electrode RME1. The first electrode RME1 may be disposed on the first electrode contact hole CTD penetrating the via layer VIA and the first passivation layer PV1. The first electrode RME1 may contact the first conductive pattern CDP1 through the first electrode contact hole CTD. The second electrode RME2 may contact the second voltage line VL2 of the third conductive layer through a second electrode contact hole CTS in the electrode stem part RM_S. The second electrode RME2 may be disposed on the second electrode contact hole CTS penetrating the via layer VIA and the first passivation layer PV1. The second electrode RME2 may contact the second voltage line VL2 through the second electrode contact hole CTS. The first electrode RME1 may be electrically connected to the first transistor T1 through the first conductive pattern CDP1 and receive the first power supply voltage. The second electrode RME2 may be electrically connected to the second voltage line VL2, and receive the second power supply voltage. However, the disclosure is not limited thereto. In an embodiment, the electrodes RME1 and RME2 may not be electrically connected to the voltage lines VL1 and VL2 of the third conductive layer, and the connection electrodes CNE may be electrically connected (e.g., directly connected) to the third conductive layer. Description of the connection electrodes CNE is provided below.

The wiring connection electrode EP may be electrically connected to the first voltage line VL1 of the third conductive layer through a third electrode contact hole CTA penetrating the via layer VIA and the first passivation layer PV1. The wiring connection electrode EP may be disposed on the third electrode contact hole CTA penetrating the via layer VIA and the first passivation layer PV1, and may contact the first voltage line VL1 through the third electrode contact hole CTA. The first electrode RME1 may be electrically connected to the wiring connection electrode EP, and an electrical signal transmitted to place (or arrange) the light emitting elements ED may be transmitted from the first voltage line VL1 to the first electrode RME1 through the wiring connection electrode EP. In a process (e.g., process of manufacturing display device 10) of placing (or arranging) the light emitting elements ED, a signal may be transmitted to each of the first voltage line VL1 and the second voltage line VL2, and these signals may be transmitted to the first electrode RME1 and the second electrode RME2, respectively.

The relative arrangement of the first electrode contact hole CTD and the second electrode contact hole CTS may be different from that of the third electrode contact hole CTA. The first electrode contact hole CTD may be disposed in the first sub-area SA1 and the second sub-area SA2, and the second electrode contact hole CTS may be formed to overlap the bank layer BNL located on a side of each sub-area SA1 or SA2 in the second direction DR2. On the other hand, the third electrode contact hole CTA may be disposed only in the first sub-area SA. For example, since the second electrode contact hole CTS and the third electrode contact hole CTA expose upper surfaces of different voltage lines VL1 and VL2, respectively, the position of each electrode contact hole may be determined accordingly. In the case of the separation parts ROP1 and ROP2 by which the electrodes RME are separated, the first separation parts ROP1 may be disposed in the first sub-area SA1 and formed (or disposed) above and below the wiring connection electrode EP, respectively. On the other hand, the second separation part ROP2 may be disposed in the second sub-area SA2 and disposed between the first electrodes RME1. Two first separation parts ROP1 may be formed in the first sub-area SA1, and one second separation part ROP2 may be formed in the second sub-area SA2.

The electrodes RME may include a conductive material having high reflectivity. For example, each of the electrodes RME may include a metal such as silver (Ag), copper (Cu) or aluminum (Al), may be an alloy including aluminum (Al), nickel (Ni) or lanthanum (La), or may have a structure in which a metal layer such as titanium (Ti), molybdenum (Mo) or niobium (Nb) and the above alloy are stacked. In some embodiments, each of the electrodes RME may be (or include) a double layer or a multi-layer in which an alloy including aluminum (Al) and at least one metal layer made of titanium (Ti), molybdenum (Mo) or niobium (Nb) are stacked.

However, the disclosure is not limited thereto, and each electrode RME may further include a transparent conductive material. For example, each electrode RME may include a material such as ITO, IZO or ITZO. In some embodiments, each electrode RME may have a structure in which a transparent conductive material and a metal layer having high reflectivity are each stacked in one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED in an upward direction (e.g., third direction DR3) above the first substrate SUB.

A first insulating layer PAS1 may be disposed in the display area DPA (e.g., entire display area DPA of FIG. 2) and may be disposed on the via layer VIA and the electrodes RME. The first insulating layer PAS1 may include an insulating material to protect the electrodes RME. The first insulating layer PAS1 may electrically insulate the electrodes RME from each other. Since the first insulating layer PAS1 covers the electrodes RME before the bank layer BNL is formed, it can prevent the electrodes RME from being damaged in the process of forming the bank layer BNL. The first insulating layer PAS1 may prevent the light emitting elements ED disposed thereon from contacting (e.g., directly contacting) other members and thus being damaged.

In an exemplary embodiment, the first insulating layer PAS1 may be stepped such that a part of an upper surface of the first insulating layer PAS1 is depressed between the electrodes RME spaced apart from each other in the second direction DR2. The light emitting elements ED may be disposed on the stepped upper surface of the first insulating layer PAS1, and a space may be formed between each of the light emitting elements ED and the first insulating layer PAS1.

The bank layer BNL may be disposed on the first insulating layer PAS1. The bank layer BNL may include parts extending in the first direction DR1 and the second direction DR2. The bank layer BNL may surround each subpixel SPXn. The bank layer BNL may surround the emission area EMA and the sub-areas SA1 and SA2 of each subpixel SPXn, and separate the emission area EMA and the sub-areas SA1 and SA2. The bank layer BNL may surround the outermost periphery of the display area DPA (e.g., refer to FIG. 2), and separate the display area DPA and the non-display area NDA (e.g., refer to FIG. 2). The bank layer BNL may be disposed (e.g., entirely disposed) in the display area DPA, and form a grid pattern. Areas exposed by the bank layer BNL in the display area DPA may be the emission area EMA and the sub-areas SA1 and SA2.

Like the bank patterns BP1 and BP2, the bank layer BNL may have a height. In some embodiments, an upper surface of the bank layer BNL may have a greater height than those of the bank patterns BP1 and BP2, and a thickness of the bank layer BNL may be equal to or greater than those of the bank patterns BP1 and BP2. The bank layer BNL may prevent ink from overflowing to adjacent subpixels SPXn in an inkjet printing process during a manufacturing process of the display device 10. Like the bank patterns BP1 and BP2, the bank layer BNL may include an organic insulating material such as polyimide.

The light emitting elements ED may be disposed in the emission area EMA. The light emitting elements ED may be disposed between different bank patterns BP1 and BP2, and may be spaced apart from each other in the first direction DR1. In an embodiment, the light emitting elements ED may extend in a direction (e.g., second direction DR2), and both ends thereof may be disposed on different electrodes RME, respectively. A length of each light emitting element ED may be greater than a distance between the electrodes RME spaced apart in the second direction DR2. The direction in which the light emitting elements ED extend may be substantially perpendicular to the first direction DR1 in which the electrodes RME extend. However, the disclosure is not limited thereto, and the direction in which the light emitting elements ED extend may also be the second direction DR2 or a direction oblique to the second direction DR2.

The light emitting elements ED may be disposed on different electrodes RME between different bank patterns BP1 and BP2. The light emitting elements ED may include first light emitting elements ED1 and second light emitting elements ED2. Ends (e.g., both ends) of the first light emitting elements ED1 may be disposed on the first electrode RME1 and the second electrode branch part RM_B2 of a second electrode RME2. Ends (e.g., both ends) of the second light emitting elements ED2 may be disposed on the first electrode RME1 and the first electrode branch part RM_B1 of another second electrode RME2. The first light emitting elements ED1 may be disposed on the right side of the first electrode RME1, and the second light emitting elements ED2 may be disposed on the left side of the first electrode RME1. The first light emitting elements ED1 may be disposed on the first electrode RME1 and a second electrode RME2, and the second light emitting elements ED2 may be disposed on the first electrode RME1 and another second electrode RME2.

The light emitting elements ED may be disposed on the first insulating layer PAS1. The light emitting elements ED may extend in a direction, and the direction in which the light emitting elements ED extend may be parallel to an upper surface of the first substrate SUB. As will be described below, each light emitting element ED may include plurality of semiconductor layers disposed in the extending direction, and the semiconductor layers may be sequentially disposed in the direction parallel to the upper surface of the first substrate SUB. However, the disclosure is not limited thereto. In case that the light emitting elements ED have a different structure, the semiconductor layers may be disposed in a direction perpendicular to the first substrate SUB.

The light emitting elements ED disposed in each subpixel SPXn may emit light of different wavelength bands depending on the materials that form the above-described semiconductor layers. However, the disclosure is not limited thereto, and the light emitting elements ED disposed in each subpixel SPXn may include semiconductor layers of a same material to emit light of a same color.

The light emitting elements ED may contact the connection electrodes CNE (e.g., first to third connection electrodes CNE1 to CNE3) and be electrically connected to the electrodes RME and the conductive layers under the via layer VIA. The light emitting elements ED may emit light of a wavelength band in response to an electrical signal.

A second insulating layer PAS2 may be disposed on the light emitting elements ED, the first insulating layer PAS1, and the bank layer BNL. The second insulating layer PAS2 may include patterns (or pattern parts) extending in the first direction DR1 between the bank patterns BP1 and BP2 and disposed on the light emitting elements ED. The patterns (or pattern parts) of the second insulating layer PAS2 may cover (e.g., partially cover) outer surfaces of the light emitting elements ED and may not cover both sides or both ends of the light emitting elements ED. The patterns (or pattern parts) of the second insulating layer PAS2 may form linear or island-shaped patterns in each subpixel SPXn in a plan view. The patterns (or pattern parts) of the second insulating layer PAS2 may protect the light emitting elements ED and fix (or hold) the light emitting elements ED in the manufacturing process of the display device 10. The second insulating layer PAS2 may fill a space between the light emitting elements ED and the first insulating layer PAS1 under the light emitting element ED. A part of the second insulating layer PAS2 may be disposed on the bank layer BNL and in the sub-areas SA1 and SA2.

The connection electrodes CNE (e.g., first to third connection electrodes CNE1 to CNE3) may be disposed on the electrodes RME and the bank patterns BP1 and BP2. The connection electrodes CNE may extend in a direction (e.g., first direction DR1) and may be spaced apart from each other. Each of the connection electrodes CNE may contact the light emitting elements ED and may be electrically connected to the third conductive layer.

The connection electrodes CNE may include the first connection electrode CNE1, a second connection electrode CNE2, and a third connection electrode CNE3.

The first connection electrode CNE1 may extend in the first direction DR1 and may be disposed on the first electrode RME1. A part of the first connection electrode CNE1 which is disposed on the first bank pattern BP1 may overlap the first electrode RME1 in a plan view. The first connection electrode CNE1 may extend in the first direction DR1 from the overlapped part thereof to the first sub-area SA1 located above the emission area EMA beyond the bank layer BNL. The first connection electrode CNE1 may contact the first electrode RME1 through a first contact part CT1 in the first sub-area SA1.

The second connection electrode CNE2 may extend in the first direction DR1 and may be disposed on the second electrode RME2. A part of the second connection electrode CNE2 which is disposed on the second bank pattern BP2 may overlap the second electrode RME2 in a plan view. The second connection electrode CNE2 may extend in the first direction DR1 from the overlapped part thereof to the first sub-area SA1 located above the emission area EMA beyond the bank layer BNL. The second connection electrode CNE2 may contact the second electrode RME2 through a second contact part CT2 in the second sub-area SA2.

The third connection electrode CNE3 may include extension parts CN_E1 and CN_E2 extending in the first direction DR1 and a first connection part CN_B1 electrically connecting the extension parts CN_E1 and CN_E2. The first extension part CN_E1 may face the first connection electrode CNE1 in the emission area EMA and be disposed on the second electrode branch part RM_B2 of the second electrode RME2. The second extension part CN_E2 may face the second connection electrode CNE2 in the emission area EMA and be disposed on the first electrode RME1. The first connection part CN_B1 may extend in the second direction DR2 on the bank layer BNL disposed below the emission area EMA, and electrically connect the first extension part CN_E1 and the second extension part CN_E2. The third connection electrode CNE3 may be disposed in the emission area EMA and on the bank layer BNL, and may not be directly connected to the electrodes RME. The second electrode branch part RM_B2 disposed under the first extension part CN_E1 may be electrically connected to the second voltage line VL2, but the second power supply voltage applied to the second electrode branch part RM_B2 may not be transmitted to the third connection electrode CNE3.

According to an embodiment, in the display device 10, some of the connection electrodes CNE may contact the electrodes RME through the contact parts CT1 and CT2 disposed in the sub-areas SA1 and SA2. The first connection electrode CNE1 may contact the first electrode RME1 through the first contact part CT1 penetrating the first insulating layer PAS1, the second insulating layer PAS2 and the third insulating layer PAS3 in the first sub-area SA1 disposed above the emission area EMA of a corresponding subpixel SPXn. The second connection electrode CNE2 may contact the second electrode RME2 through the second contact part CT2 penetrating the first insulating layer PAS1, the second insulating layer PAS2 and the third insulating layer PAS3 in the second sub-area SA2 disposed below the emission area EMA of the corresponding subpixel SPXn. The first connection electrode CNE1 and the second connection electrode CNE2 may be electrically connected to the third conductive layer through the electrodes RME, respectively. A part of the first electrode RME1 which is disposed in the sub-area SA1 or SA2 may overlap the first contact part CT1 in a plan view. The second electrode RME2 may include parts protruding in the second direction DR2 from the electrode stem part RM_S and disposed in the sub-areas SA1 and SA2. The second electrode RME2 may overlap the second contact parts CT2 in the protruding parts.

The first connection electrode CNE1 may be electrically connected to the first transistor T1 and receive the first power supply voltage. The second connection electrode CNE2 may be electrically connected to the second voltage line VL2 and receive the second power supply voltage. Each connection electrode CNE may contact the light emitting elements ED in the emission area EMA and transmit a power supply voltage to the light emitting elements ED.

The third connection electrode CNE3 may not contact the electrodes RME, unlike the first connection electrode CNE1 or the second connection electrode CNE2. The first connection electrode CNE1 and the second connection electrode CNE2 may be first type connection electrodes which contact the electrodes RME. The third connection electrode CNE3 may be a second type connection electrode which does not contact the electrodes RME. The third connection electrode CNE3 may be electrically connected to the first connection electrode CNE1 and the second connection electrode CNE2 through the light emitting elements ED.

The connection electrodes CNE (e.g., first to third connection electrodes CNE1 to CNE3) may contact the light emitting elements ED. The connection electrodes CNE (e.g., first to third connection electrodes CNE1 to CNE3) may be electrically connected to the electrodes RME or a conductive layer under the electrodes RME. For example, each of the first connection electrode CNE1 and the second connection electrode CNE2 may be disposed on the third insulating layer PAS3 and may contact the light emitting elements ED. The third connection electrode CNE3 may be disposed on the second insulating layer PAS2 and may contact the light emitting elements ED. The first connection electrode CNE1 may overlap (e.g., partially overlap) the first electrode RME1 in a plan view and may contact ends of the light emitting elements ED. The second connection electrode CNE2 may overlap (e.g., partially overlap) a second electrode RME2 in a plan view and may contact other ends of the light emitting elements ED. The third connection electrode CNE3 may be disposed over the first electrode RME1 and another second electrode RME2 and may contact the light emitting elements ED. Each of the connection electrodes CNE may contact the light emitting elements ED in a part disposed in the emission area EMA. Each of the connection electrodes CNE may be electrically connected to the third conductive layer in a part (e.g., another part) disposed in the sub-area SA1 or SA2.

The light emitting elements ED may be classified into different light emitting elements ED according to the connection electrodes CNE that both ends thereof contact in the above arrangement structure of the connection electrodes CNE. The first light emitting elements ED1 and the second light emitting elements ED2 may contact a first type connection electrode and a second type connection electrode. First ends of the first light emitting elements ED1 may contact the first connection electrode CNE1, and second ends of the second light emitting elements ED2 may contact the second connection electrode CNE2. Second ends of the first light emitting elements ED1 may contact the third connection electrode CNE3, and first ends of the second light emitting elements ED2 may contact the third connection electrode CNE3. The light emitting elements ED1 and ED2 may be electrically connected to each other in series through the connection electrodes CNE. Since the display device 10 according to the current embodiment includes a greater number of light emitting elements ED in each subpixel SPXn and forms a series connection of the light emitting elements ED, the amount of light emitted per unit area may be increased.

However, the disclosure is not limited thereto. In some embodiments, the connection electrodes CNE may contact (e.g., directly contact) the third conductive layer or may be electrically connected to the third conductive layer through patterns other than the electrodes RME.

The connection electrodes CNE may include at least one conductive material of ITO, IZO, ITZO, and aluminum (Al). For example, the connection electrodes CNE may include a transparent conductive material, and light emitted from the light emitting elements ED may be output through the connection electrodes CNE.

A third insulating layer PAS3 may be disposed on the third connection electrode CNE3 and the second insulating layer PAS2. The third insulating layer PAS3 may be disposed (e.g., entirely disposed on the second insulating layer PAS2, and cover the third connection electrode CNE3. The first connection electrode CNE1 and the second connection electrode CNE2 may be disposed on the third insulating layer PAS3. The third insulating layer PAS3 may be disposed (e.g., entirely disposed) on the via layer VIA except for areas in which the first connection electrode CNE1 and the second connection electrode CNE2 are disposed. The third insulating layer PAS3 may insulate (e.g., electrically insulate) the first connection electrode CNE1 and the second connection electrode CNE2 from the third connection electrode CNE3 so that they do not directly contact the third connection electrode CNE3.

The display device 10 may include an opening OP disposed between the second electrode branch part RM_B2 of the second electrode RME2 and the bank layer BNL in the emission area EMA. The opening OP may penetrate the second insulating layer PAS2 and the third insulating layer PAS3. The opening OP may extend in the first direction DR1 between the second electrode branch part RM_B2 and the bank layer BNL. The opening OP may provide an exit path of light totally reflected in the connection electrodes CNE or the first insulating layer PAS1 among the light emitted from the light emitting elements ED. For example, a portion of the light emitted from the light emitting elements ED may be totally reflected in the connection electrodes CNE (or first insulating layer PAS1) by the exit path provided by the opening OP. However, the disclosure is not limited thereto, and the opening OP may also be omitted.

Although not illustrated in the drawings, another insulating layer may be further disposed on the third insulating layer PAS3, the first connection electrode CNE1, and the second connection electrode CNE2. The insulating layer may protect members (e.g., light emitting elements ED) disposed on the first substrate SUB from an external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least one of the first insulating layer PAS1, the second insulating layer PAS2, and the third insulating layer PA3 may be formed in a structure in which multiple insulating layers are alternately or repeatedly stacked. In an exemplary embodiment, each of the first insulating layer PAS1, the second insulating layer PAS2, and the third insulating layer PAS3 may be (or include) at least one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of a same material, or some may be made of a same material while the others are made of different materials, or may be made of different materials.

In the display device 10 according to the embodiment, the first and second contact parts CT1 and CT2 may be disposed in each of the sub-areas SAT and SA2 among the areas surrounded by the bank layer BNL. The first and second contact parts CT1 and CT2 may penetrate the first insulating layer PAS1, the second insulating layer PAS2, and the third insulating layer PAS3. The first and second contact parts CT1 and CT2 may not be disposed in the emission area EMA in which the light emitting elements ED are disposed. Accordingly, it is possible to prevent light emitted from the light emitting elements ED from being reflected or refracted by the contact parts CT1 and CT2 and thus failing to be output.

According to the arrangement of the contact parts CT1 and CT2 and the light emitting elements ED, some of the connection electrodes CNE may be disposed over the emission area EMA and the sub-areas SA1 and SA2. The first connection electrode CNE1 may extend from the emission area EMA to the first sub-area SA1 disposed above the emission area EMA. The second connection electrode CNE2 may extend from the emission area EMA to the second sub-area SA2 disposed below the emission area EMA. The first connection electrode CNE1 and the second connection electrode CNE2 may be connection electrodes disposed on the third insulating layer PAS3 and may be disposed on a same layer. The first connection electrode CNE1 and the second connection electrode CNE2 may be formed by depositing a material that forms the connection electrodes on the same layer and performing a patterning process using photoresist.

The first connection electrode CNE1 and the second connection electrode CNE2 may be disposed over the emission area EMA and the sub-areas SA1 and SA2 along a step (or step difference) of the bank layer BNL. The bank layer BNL may have a greater thickness than that of the connection electrodes CNE, and residues of the connection electrodes CNE may remain on inclined side surfaces of the bank layer BNL in a process of patterning the connection electrodes CNE. The first connection electrode CNE1 and the second connection electrode CNE2 disposed on a same layer may be electrically connected to (or short-circuited) each other caused by the residues of the material of the connection electrodes CNE in case that the first connection electrode CNE1 and the second connection electrode CNE2 are disposed adjacent to each other. In the display device 10 according to the embodiment, since the first connection electrode CNE1 and the second connection electrode CNE2 extend from the emission area EMA to different sub-areas SA1 and SA2, the first connection electrode CNE1 and the second connection electrode CNE2 may not be disposed adjacent to each other. For example, the first connection electrode CNE1 and the second connection electrode CNE2 may extend beyond (or disposed over) the bank layer BNL and disposed in the sub-areas SA1 and SA2, respectively. In other embodiments, the first connection electrode CNE1 and the second connection electrode CNE2 may extend beyond (or disposed over) different parts of the bank layer BNL and may be disposed in different sub-areas SA1 and SA2. Accordingly, the short circuit (or electrical connection) between the first connection electrode CNE1 and the second connection electrode CNE2 caused by the residues remaining on the side surfaces of the bank layer BNL may be prevented.

Figure 11:
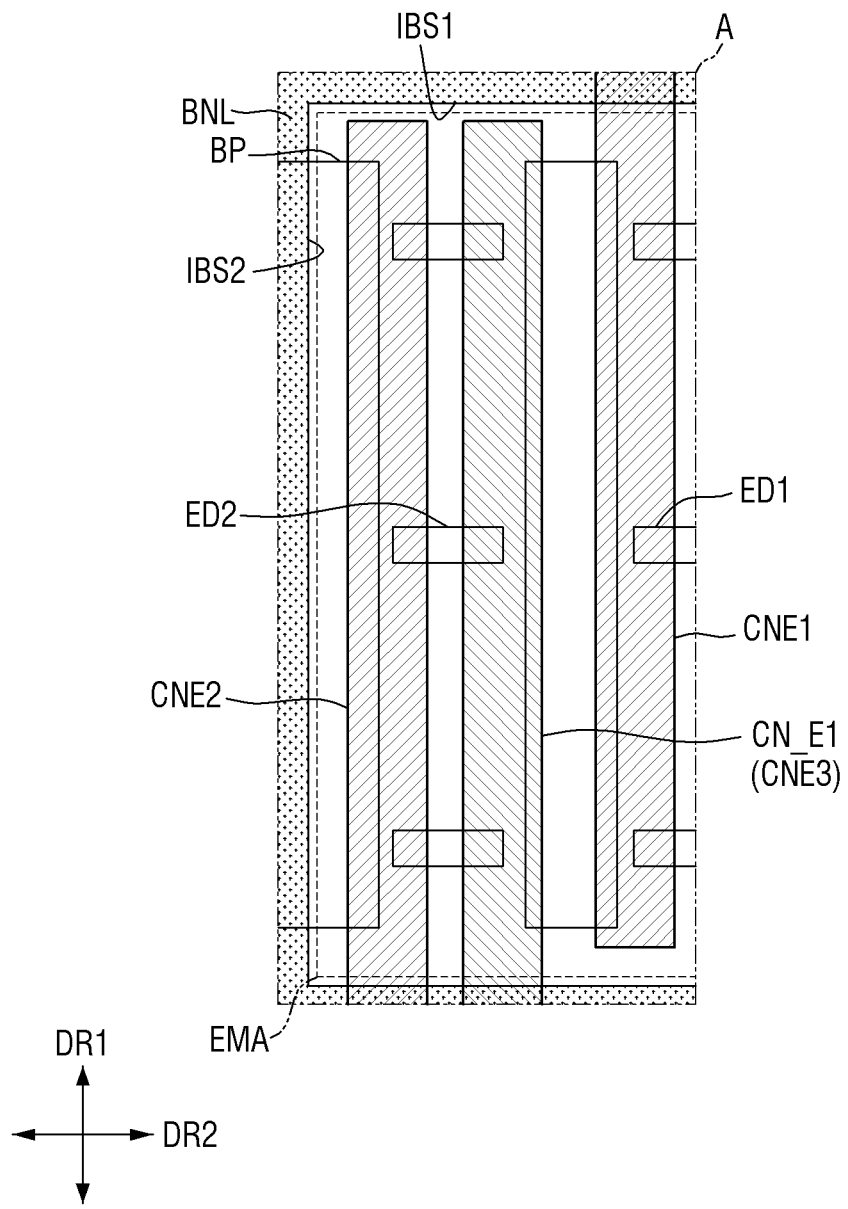
FIG. 11 is a schematic enlarged view of part A of FIG. 6.

FIG. 11 is a schematic enlarged view of part A of FIG. 6.

Referring to FIGS. 6 and 11, the first connection electrode CNE1 of the display device 10 according to the embodiment may extend in the first direction DR1 from the emission area EMA to the first sub-area SA1. The first connection electrode CNE1 may extend beyond an upper bank part disposed above the emission area EMA among parts of the bank layer BNL which extend in the second direction DR1. On the contrary, the second connection electrode CNE2 may extend in the first direction DR1 from the emission area EMA to the second sub-area SA2. The second connection electrode CNE2 may extend beyond (or disposed over) a lower bank part disposed below the emission area EMA among the parts of the bank layer BNL which extend in the second direction DR2.

The bank layer BNL may include inner side surfaces IBS1 and IBS2 facing the emission area EMA. For example, the bank layer BNL may include first inner side surfaces IBS1 extending in the second direction DR2 and second inner side surfaces IBS2 extending in the first direction DR1. The first connection electrode CNE1 may extend beyond (or disposed over) the first inner side surface IBS1 of the upper bank part of the bank layer BNL to the first sub-area SA1. The first connection electrode CNE1 may be spaced apart from the first inner side surface IBS1 of the lower bank part. In another example, the first connection electrode CNE1 may be spaced apart from the lower bank part of the bank layer BNL and may overlap the upper bank part in a plan view. The second connection electrode CNE2 may extend beyond (or disposed over) the first inner side surface IBS1 of the lower bank part of the bank layer BNL to the second sub-area SA2. The second connection electrode CNE2 may be spaced apart from the first inner side surface IBS1 of the upper bank part. In another example, the second connection electrode CNE2 may be spaced apart from the upper bank part of the bank layer BNL and may overlap the lower bank part in a plan view. In the third connection electrode CNE3, each of the first extension part CN_E1 and the second extension part CN_E2 may be spaced apart from the upper bank part of the bank layer BNL in the first direction DR1, and the first connection part CN_B1 may be disposed on the lower bank part of the bank layer BNL.

In the process of forming the first connection electrode CNE1 and the second connection electrode CNE2 disposed on a same layer, residues of the material that form the connection electrodes CNE1 and CNE2 may be formed (or remain) on the first inner side surfaces IBS1 and the second inner side surfaces IBS2 of the bank layer BNL. Although not illustrated in the drawings, the residues may also be formed on inner side surfaces facing the sub-areas SA1 and SA2 among the inner side surfaces (e.g., IBS1, IBS2) of the bank layer BNL. Since the first connection electrode CNE1 and the second connection electrode CNE2 overlap the upper bank part and the lower bank part in a plan view and are spaced apart from the lower bank part and the upper bank part, respectively, even if residues remain on the inner side surfaces IBS1 and IBS2 of the bank layer BNL, the probability that the first connection electrode CNE1 and the second connection electrode CNE2 will be directly connected to each other may be low. For example, the second connection electrode CNE2 may be spaced apart from the upper bank part of the bank layer BNL in the first direction DR1, and the first connection electrode CNE1 may be spaced apart from the lower bank part of the bank layer BNL in the first direction DR1. Accordingly, in order for the first connection electrode CNE1 and the second connection electrode CNE2 to be directly connected to each other, residues connected along the first and second inner side surfaces IBS1 and IBS2 must be formed. However, since residues remaining on the inner side surfaces IBS1 and IBS2 of the bank layer BNL are almost removed during a process, leaving only some, the probability that residues connected along the first and second inner side surfaces IBS1 and IBS2 will remain may be low.

In the display device 10 according to the embodiment, since the first connection electrode CNE1 and the second connection electrode CNE2 extend in different directions from the emission area EMA and extend beyond (or disposed over) the bank layer BNL, the probability that they will be directly connected to each other by residues remaining on the inner side surfaces IBS1 and IBS2 may be reduced, and light emission failure of a corresponding subpixel SPXn may be prevented.

Figure 12:
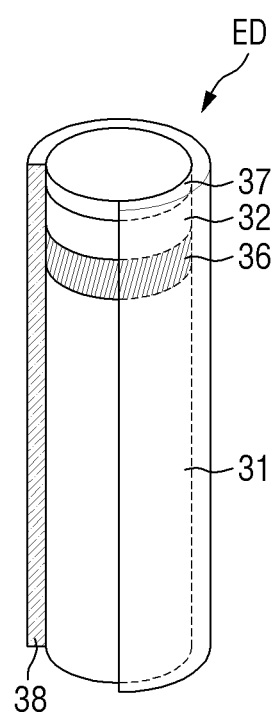
FIG. 12 is a schematic view of a light emitting element according to an embodiment.

FIG. 12 is a schematic view of a light emitting element ED according to an embodiment.

Referring to FIG. 12, the light emitting element ED may be a light emitting diode. The light emitting element ED may be an inorganic light emitting diode having a size of nanometers to micrometers and made of an inorganic material. In case that an electric field is formed in a direction between two electrodes facing each other, the light emitting element ED may be aligned between the two electrodes in which polarities are formed.

The light emitting element ED according to the embodiment may extend in a direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped, a hexagonal prism, or the like. For example, the light emitting element ED may have a shape extending in a direction and having a partially inclined outer surface.

The light emitting element ED may include a semiconductor layer doped with impurities of any conductivity type (e.g., a p type or an n type). The semiconductor layer may receive an electrical signal from an external power source and emit light in a wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be (or include) at least one of AlGaInN, GaN, AlGaN, InGaN, AlN, and InN, which is doped with an n-type dopant. The n-type dopant used to dope the first semiconductor layer 31 may be Si, Ge, Sn, or the like.

The second semiconductor layer 32 may be disposed on the first semiconductor layer 31, and the light emitting layer 36 may be interposed between the first semiconductor layer 31 and the second semiconductor layer 32. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be (or include) at least one of AlGaInN, GaN, AlGaN, InGaN, AlN, and InN, which is doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include a greater number of layers. For example, each of the first semiconductor layer 31 and the second semiconductor layer 32 may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be (or include) at least one of AlGaInN, GaN, AlGaN, InGaN, AlN, InN, and SLs, which is doped with an n-type dopant. The semiconductor layer disposed between the second semiconductor layer 32 and the light emitting layer 36 may be (or include) at least one of AlGaInN, GaN, AlGaN, InGaN, AlN, and InN, which is doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, the light emitting layer 36 may have a structure in which multiple quantum layers and multiple well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN, AlGaInN, or InGaN. For example, in case that the light emitting layer 36 has a multiple quantum well structure in which at least one quantum layer and at least one well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include group 3 to 5 semiconductor materials depending on the wavelength band of light that it emits. Light emitted from the light emitting layer 36 is not limited to light in a blue wavelength band. In some embodiments, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode (e.g., electrodes RME of FIG. 4) or a connection electrode (e.g., connection electrodes CNE of FIG. 4) in the display device 10, the electrode layer 37 may reduce the resistance between the light emitting element ED and the electrode (e.g., electrodes RME of FIG. 4) or the connection electrode (e.g., connection electrodes CNE of FIG. 4). The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (ISO), and indium tin zinc oxide (ITZO).

The insulating film 38 may surround outer surfaces of the semiconductor layers 31, 32, and 36 and the electrode layer 37 described above. For example, the insulating film 38 may surround an outer surface of at least part of the light emitting layer 36 but may expose both ends of the light emitting element ED in a longitudinal direction thereof. An upper surface of the insulating film 38 may also be rounded in cross section in an area adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide (HMO, and titanium oxide ($TiO_x$). Although the insulating film 38 is illustrated as a single layer in the drawing, the disclosure is not limited thereto. In some embodiments, the insulating film 38 may be formed in a multi-layer structure in which multiple layers are stacked.

The insulating film 38 may protect the semiconductor layers 31, 32, and 36 and the electrode layer 37 of the light emitting element ED. The insulating film 38 may prevent an electrical short circuit that may occur in the light emitting layer 36 in case that the light emitting layer 36 contacts (e.g., directly contacts) an electrode through which an electrical signal is transmitted to the light emitting element ED. The insulating film 38 may prevent a reduction in luminous efficiency of the light emitting element ED.

An outer surface of the insulating film 38 may be surface-treated. The light emitting elements ED may be dispersed in an ink and sprayed onto electrodes in a state where it is dispersed in a ink and then may be aligned. Here, the surface of the insulating film 38 may be hydrophobic or hydrophilic-treated so that the light emitting element ED remains separate from other adjacent light emitting elements ED in the ink without agglomerating with them.

Description of other embodiments of the display device 10 is provided below with reference to other drawings.

Figure 13:
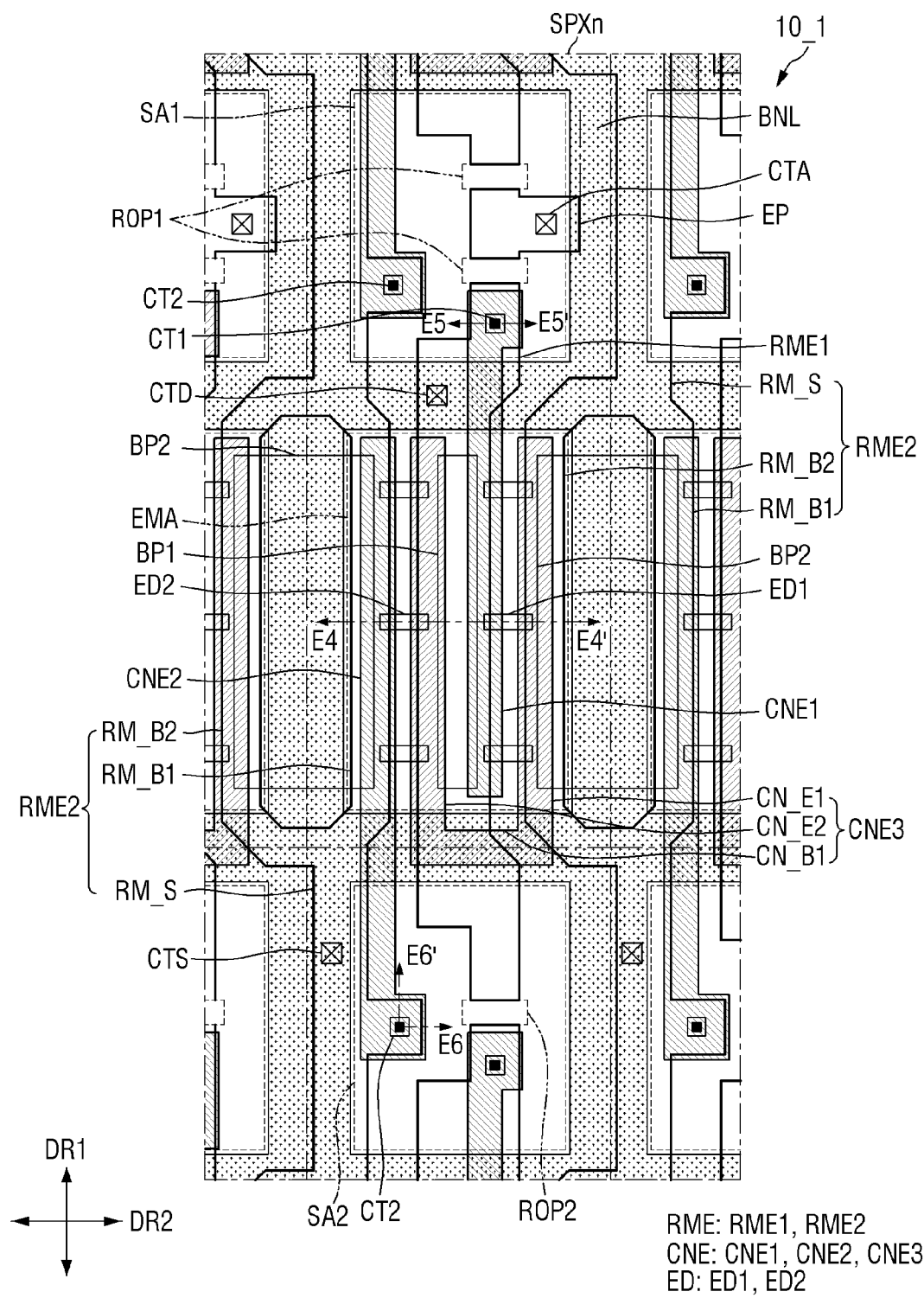
FIG. 13 is a schematic plan view of a subpixel of a display device according to an embodiment.
Figure 14:
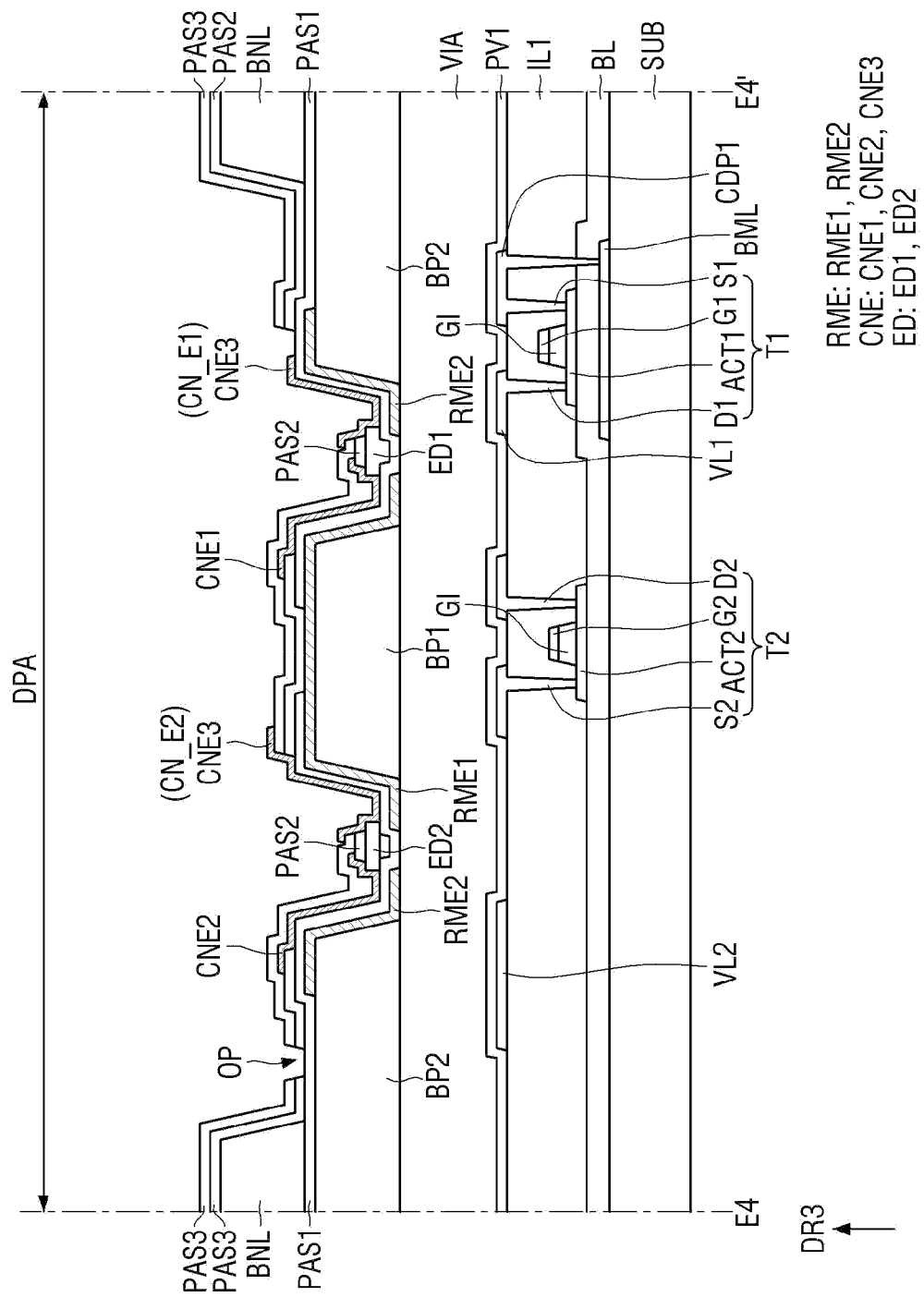
FIG. 14 is a schematic cross-sectional view taken along line E4-E4' of FIG. 13.
Figure 15:
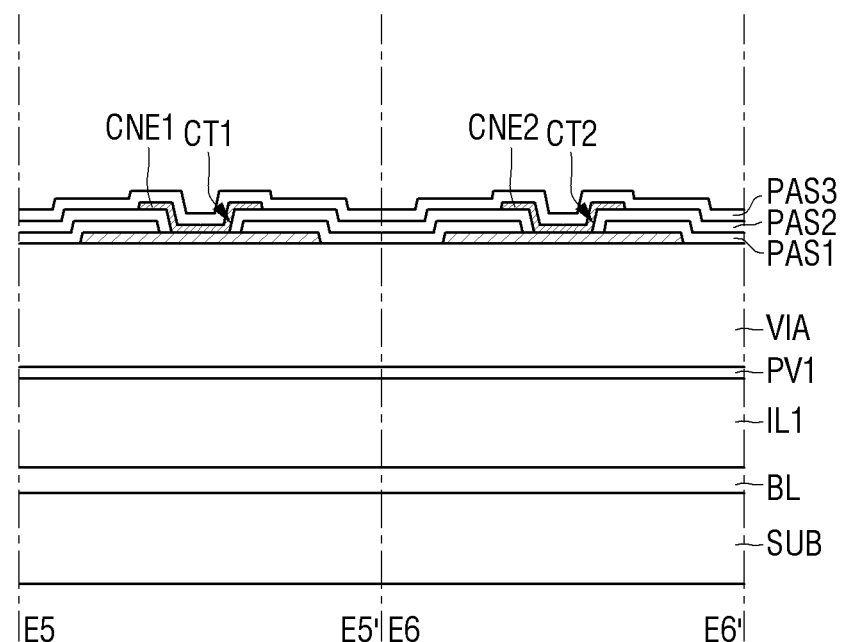
FIG. 15 is a schematic cross-sectional view taken along lines and E6-E6' of FIG. 13.

FIG. 13 is a schematic plan view of a subpixel SPXn of a display device 10_1 according to an embodiment. FIG. 14 is a schematic cross-sectional view taken along line E4-E4' of FIG. 13. FIG. 15 is a schematic cross-sectional view taken along lines E5-E5' and E6-E6' of FIG. 13.

Referring to FIGS. 13 to 15, the display device 10_1 according to the embodiment may include a first connection electrode layer and a second connection electrode layer. The first connection electrode layer may include a first connection electrode CNE1 and a second connection electrode CNE2 and may be disposed between a second insulating layer PAS2 and a third insulating layer PAS3. The second connection electrode layer may include a third connection electrode CNE3 and may be disposed on the third insulating layer PAS3. The embodiment of FIGS. 13 to 15 is different from the embodiment of FIGS. 4 to 11 in that the first connection electrode CNE1, the second connection electrode CNE2, and the third connection electrode CNE3 are disposed on different layers.

For example, each of the first connection electrode CNE1 and the second connection electrode CNE2 may be disposed on the second insulating layer PAS2, and may contact light emitting elements ED. The third connection electrode CNE3 may be disposed on the third insulating layer PAS3 and may contact the light emitting elements ED, The first connection electrode CNE1 may contact a first electrode RME1 through a first contact part CT1 in a first sub-area SA1 disposed above an emission area EMA of a corresponding subpixel SPXn. The first contact part CT1 may penetrate the first insulating layer PAS1 and the second insulating layer PAS2. The second connection electrode CNE2 may contact a second electrode RME2 through a second contact part CT2 in a second sub-area SA2 disposed below the emission area EMA of the corresponding subpixel SPXn. The second electrode RME2 may penetrate the first insulating layer PAS1 and the second insulating layer PAS2.

Figure 16:
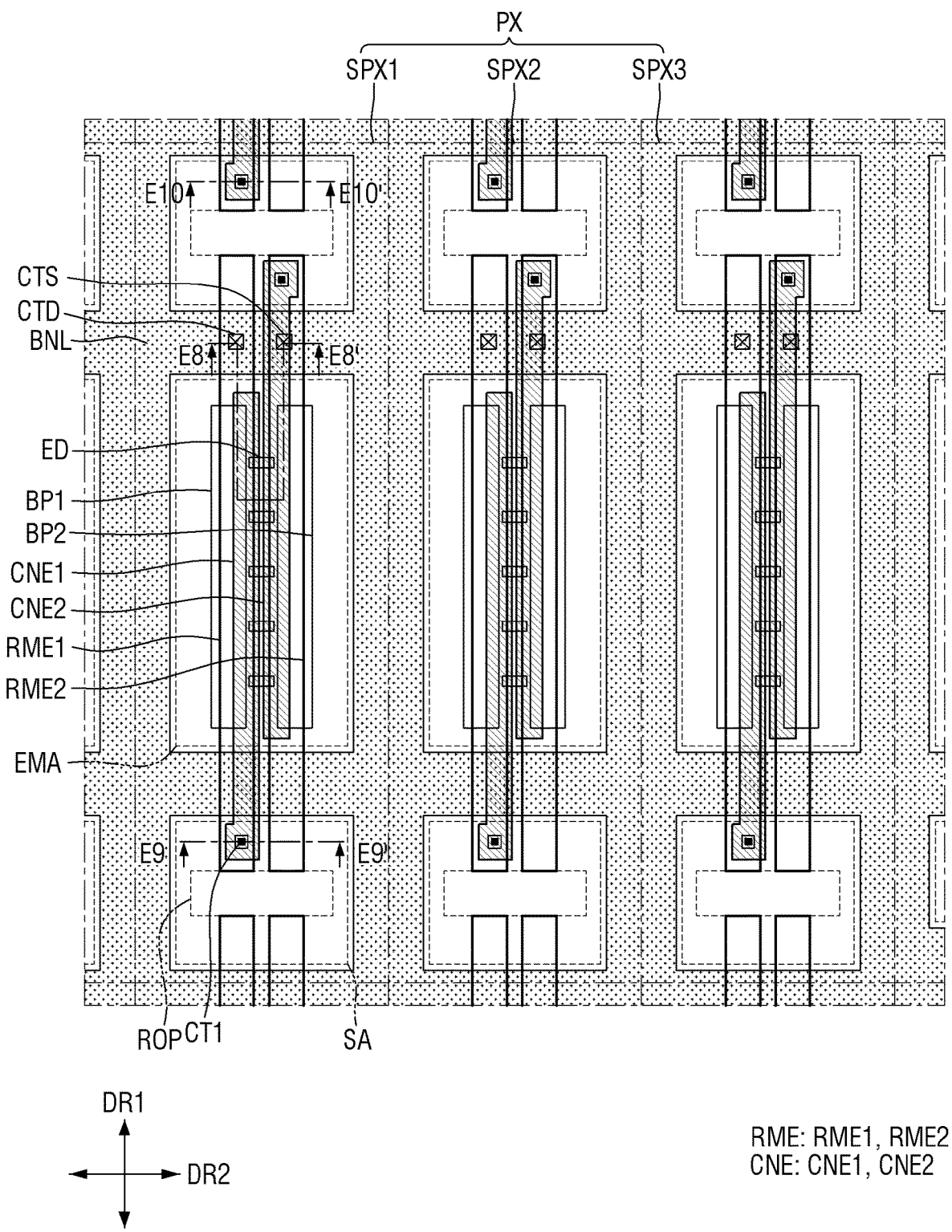
FIG. 16 is a schematic plan view of a subpixel of a display device according to an embodiment.
Figure 17:
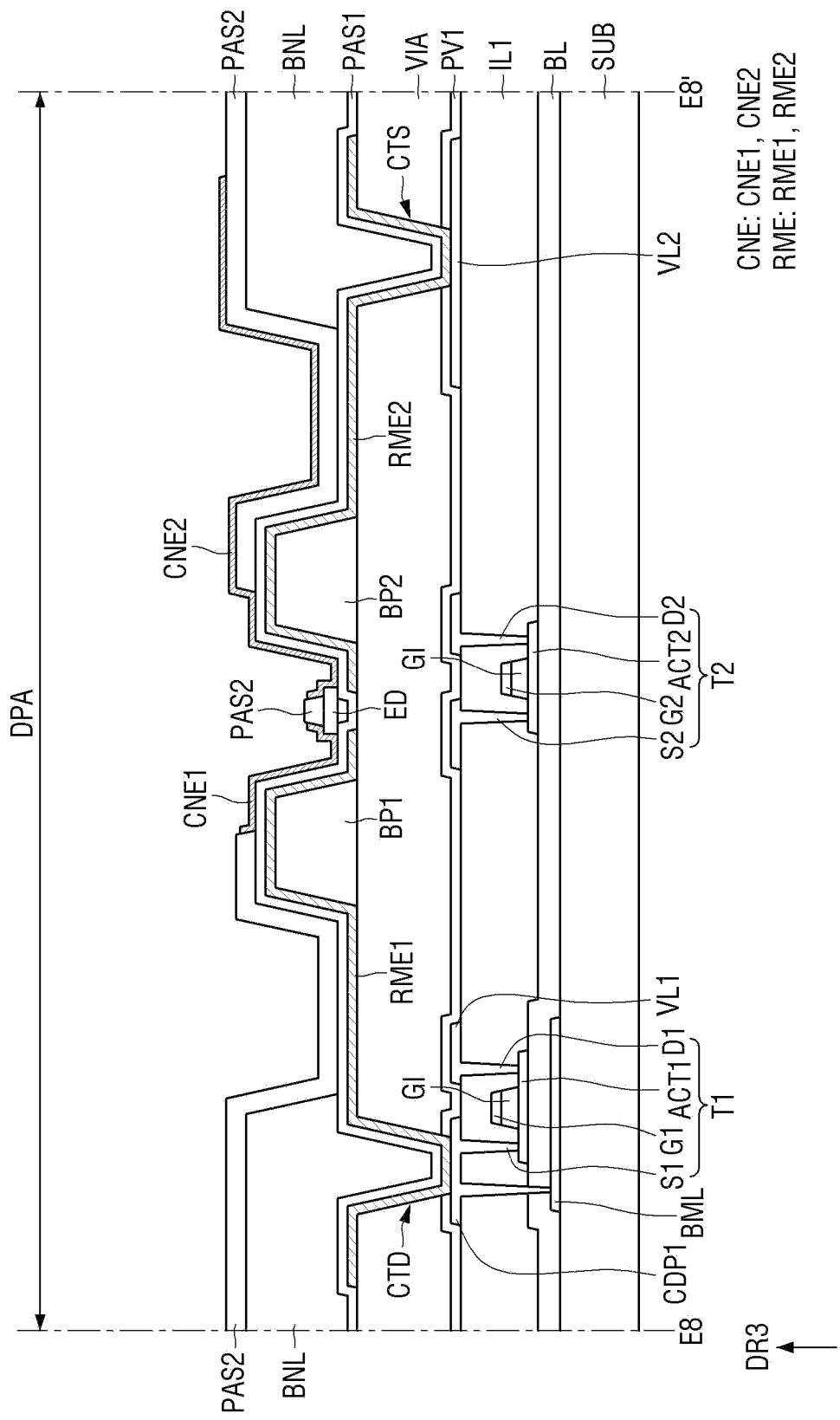
FIG. 17 is a schematic cross-sectional view taken along line E8-E8' of FIG. 16.
Figure 18:
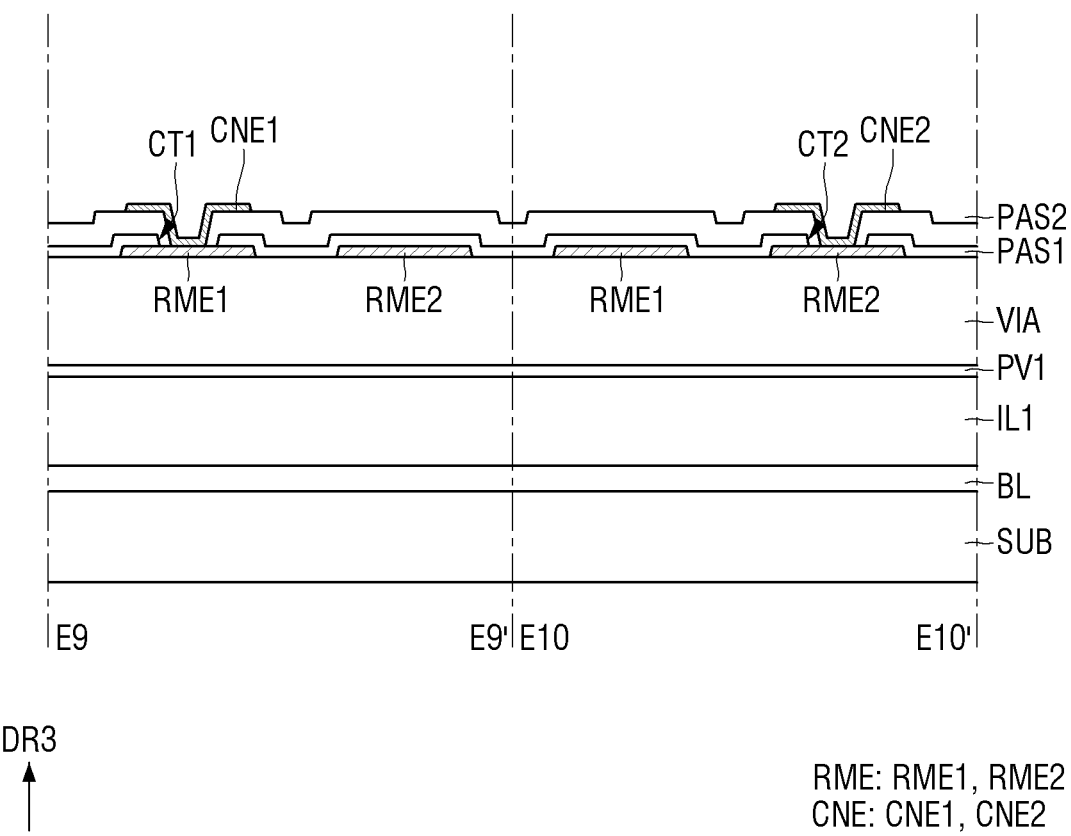
FIG. 18 is a schematic cross-sectional view taken along lines E9-E9' and E10-E10' of FIG. 16.

FIG. 16 is a schematic plan view of a subpixel SPXn of a display device 10_2 according to an embodiment, FIG. 17 is a schematic cross-sectional view taken along line E8-E8' of FIG. 16. FIG. 18 is a schematic cross-sectional view taken along lines E9-E9' and E10-E10' of FIG. 16.

Referring to FIGS. 16 to 18, in the display device 10_2 according to the embodiment, the arrangement of electrodes RME, connection electrodes CNE, and light emitting elements ED of each subpixel SPXn may be different. For example, the display device 10_2 according to the embodiment may include two electrodes RME (e.g., first and second electrodes RME1 and RME2) and two connection electrodes CNE (e.g., first and second connection electrodes CNE1 and CNE2) in each subpixel SPXn. Thus, a redundant description will be omitted, and differences will be mainly described below.

The display device 10_2 may include a first bank pattern BP1 and a second bank pattern BP2 disposed in each subpixel SPXn. The first bank pattern BP1 and the second bank pattern BP2 may be spaced apart from each other in the second direction DR2 in an emission area EMA of each subpixel SPXn. The first bank pattern BP1 may be disposed on a left side of the center of the emission area EMA which is a first side in the second direction DR2. The second bank pattern BP2 may be spaced apart from the first bank pattern BP1 and may be disposed on a right side of the center of the emission area EMA which is a second side in the second direction DR2. The first bank pattern BP1 and the second bank pattern BP2 may be alternately disposed in the second direction DR2, and may be disposed as island-shaped patterns in a display area DPA (e.g., refer to FIG. 2). Light emitting elements ED may be disposed between the first bank pattern BP1 and the second bank pattern BP2.

The first bank pattern BP1 and the second bank pattern BP2 may have a same length in the first direction DR1. The length of the first bank pattern BP1 and the second bank pattern BP2 may be smaller than a length, in the first direction DR1, of the emission area EMA surrounded by a bank layer BNL. The first bank pattern BP1 and the second bank pattern BP2 may be spaced apart from parts of the bank layer BNL which extend in the second direction BP2. The first bank pattern BP1 and the second bank pattern BP2 may have a same width in the second direction DR2.

Multiple bank patterns BP1 and BP2 may be disposed on a via layer VIA. For example, the bank patterns BP1 and BP2 may be disposed (e.g., directly disposed) on the via layer VIA, and at least a part of each of the bank patterns BP1 and BP2 may protrude from an upper surface of the via layer VIA. The protruding part of each of the bank patterns BP1 and BP2 may have side surfaces inclined or curved with a curvature, and light emitted from the light emitting elements ED may be reflected upward above the via layer VIA by the electrodes RME disposed on the bank patterns BP1 and BP2.

Multiple electrodes RME (e.g., first and second electrodes RME1 and RME2) may extend in a direction, and are disposed in each subpixel SPXn. The electrodes RME1 and RME2 may extend in the first direction DR1 and be disposed in the emission area EMA and sub-areas SA of each subpixel SPXn, and may be spaced apart from each other in the second direction DR2.

The display device 10_2 may include a first electrode RME1 and a second electrode RME2 disposed in each subpixel SPXn. The first electrode RME1 may be disposed on the lefts side of the center of the emission area EMA. The second electrode RME2 may be spaced apart from the first electrode RME1 in the second direction DR2 and disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may extend beyond (or disposed over) the bank layer BNL to be disposed in a corresponding subpixel SPXn and the sub-areas SA. The first electrodes RME1 and the second electrodes RME2 of different subpixels SPXn may be spaced apart from each other by a separation part ROP located in a sub-area SA of any subpixel SPXn.

The first electrode RME1 and the second electrode RME2 may be disposed on at least one of the inclined side surfaces of the bank patterns BP1 and BP2. In an embodiment, a width of each electrode RME measured in the second direction DR2 may be smaller than a width of each of the bank patterns BP1 and BP2 measured in the second direction DR2. A distance between the first electrode RME1 and the second electrode RME2 in the second direction DR2 may be smaller than a distance between the bank patterns BP1 and BP2. At least a part of each of the first electrode RME1 and the second electrode RME2 may be disposed (e.g., directly disposed) on the via layer VIA so that the first and second electrodes RME1 and RME2 are disposed in the same plane.

Each electrode RME may contact (e.g., directly contact) a third conductive layer through an electrode contact hole CTD or CTS in a part of the electrode RME, which overlaps the bank layer BNL, between the emission area EMA and a sub-area SA in a plan view. A first electrode contact hole CTD may be formed in an area in which the bank layer BNL and the first electrode RME1 overlap each other. A second electrode contact hole CTS may be formed in an area in which the bank layer BNL and the second electrode RME2 overlap each other in a plan view. The first electrode RME1 may contact a first conductive pattern CDP1 through the first electrode contact hole CTD penetrating the via layer VIA and a first passivation layer PV1. The second electrode RME2 may contact a second voltage line VL2 through the second electrode contact hole CTS penetrating the via layer VIA and the first passivation layer PV1. The first electrode RME1 may be electrically connected to a first transistor T1 through the first conductive pattern CDP1, and receive a first power supply voltage. The second electrode RME2 may be electrically connected to the second voltage line VL2, and receive a second power supply voltage.

The light emitting elements ED may be disposed in the emission area EMA. The light emitting elements ED may be disposed between the bank patterns BP1 and BP2, and may be spaced apart from each other in the first direction DR1. The light emitting elements ED may contact the connection electrodes CNE (e.g., first and second connection electrodes CNE1 and CNE2), and be electrically connected to the electrodes RME and conductive layers under the via layer VIA. The light emitting elements ED may emit light of a wavelength band in response to an electrical signal.

A second insulating layer PAS2 may be disposed on the light emitting elements ED, a first insulating layer PAS1, and the bank layer BNL. The second insulating layer PAS2 may include a pattern (or pattern part) extending in the first direction DR1 between the bank patterns BP1 and BP2 and disposed on the light emitting elements ED. The pattern (or pattern part) of the second insulating layer PAS2 may cover (e.g., partially cover) outer surfaces of the light emitting elements ED, and may not cover both sides or both ends of the light emitting elements ED. The pattern (or pattern part) of the second insulating layer PAS2 may form a linear or island-shaped pattern in each subpixel SPXn in a plan view. The pattern (or pattern part) of the second insulating layer PAS2 may protect the light emitting elements ED and fix (or hold) the light emitting elements ED in a manufacturing process of the display device 10_2. The second insulating layer PAS2 may fill a space between the light emitting elements ED and the first insulating layer PAS1 under the light emitting element ED. A part of the second insulating layer PAS2 may be disposed on the bank layer BNL and in the sub-areas SA.

The connection electrodes CNE (e.g., first and second connection electrodes CNE1 and CNE2) may be disposed on the electrodes RME and the bank patterns BP1 and BP2. The connection electrodes CNE may extend in a direction (e.g., first direction DR1), and may be spaced apart from each other. Each of the connection electrodes CNE may contact the light emitting elements ED, and may be electrically connected to the third conductive layer.

The connection electrodes CNE may include a first connection electrode CNE1 and a second connection electrode CNE2 disposed in each subpixel SPXn. The first connection electrode CNE1 may extend in the first direction DR1, and may be disposed on the first electrode RME1 or the first bank pattern BP1. The first connection electrode CNE1 may overlap (e.g., partially overlap) the first electrode RME1 in a plan view, and may extend from the emission area EMA to a sub-area SA beyond the bank layer BNL. The first connection electrode CNE1 may extend to the sub-area SA disposed below the emission area EMA, and extend beyond (or disposed over) a lower bank part of the bank layer BNL.

The second connection electrode CNE2 may extend in the first direction DR1 and may be disposed on the second electrode RME2 or the second bank pattern BP2. The second connection electrode CNE2 may overlap (e.g., partially overlap) the second electrode RME2 in a plan view, and may extend from the emission area EMA to a sub-area SA beyond the bank layer BNL. The second connection electrode CNE2 may extend to the sub-area SA disposed above the emission area EMA, and extend beyond (or disposed over) an upper bank part of the bank layer BNL.

Each of the first connection electrode CNE1 and the second connection electrode CNE2 may contact the light emitting elements ED, and may be electrically connected to an electrode RME or a conductive layer under the electrode RME. For example, each of the first connection electrode CNE1 and the second connection electrode CNE2 may be disposed on side surfaces of the second insulating layer PAS2, and may contact the light emitting elements ED. The first connection electrode CNE1 may overlap (e.g., partially overlap) the first electrode RME1 in a plan view, and may contact ends of the light emitting elements ED. The second connection electrode CNE2 may overlap (e.g., partially overlap) the second electrode RME2 in a plan view, and may contact other ends of the light emitting elements ED. The connection electrodes CNE may be disposed over the emission area EMA and the sub-areas SA. Each of the connection electrodes CNE may contact the light emitting elements ED in a part thereof disposed in the emission area EMA, and may be electrically connected to the third conductive layer in a part (e.g., another part) thereof disposed in a sub-area SA.

According to an embodiment, in the display device 10_2, each of the connection electrodes CNE may contact an electrode RME through a contact part CT1 or CT2 disposed in a sub-area SA. The first connection electrode CNE1 may contact the first electrode RME1 through a first contact part CT1 in a lower sub-area SA disposed below the emission area EMA of a corresponding subpixel SPXn. The second connection electrode CNE2 may contact the second electrode RME2 through a second contact part CT2 in an upper sub-area SA disposed above the emission area EMA of the corresponding subpixel SPXn.

In the display device 10_2, a third insulating layer PAS3 (e.g., refer to FIG. 8) may be omitted, and the first connection electrode CNE1 and the second connection electrode CNE2 may be disposed on a same layer. The second insulating layer PAS2 may include an organic insulating material, and the first connection electrode CNE1 and the second connection electrode CNE2 may be disposed partially on the second insulating layer PAS2. For example, the first connection electrode CNE1 and the second connection electrode CNE2 may contact (e.g., directly contact) the second insulating layer PAS2 disposed on the light emitting elements ED in the emission area EMA. The first connection electrode CNE1 and the second connection electrode CNE2 may contact the side surfaces of the second insulating layer PAS2 disposed on the light emitting elements ED.

In an embodiment in which each subpixel SPXn includes two electrodes RME and two connection electrodes CNE and the third insulating layer PAS3 (e.g., refer to FIG. 8) is omitted, the first connection electrode CNE1 and the second connection electrode CNE2 may be disposed on a same layer. As described above, the first connection electrode CNE1 and the second connection electrode CNE2 may extend beyond (or disposed over) the bank layer BNL, and may extend beyond (or disposed over) different parts (e.g., the upper bank part and the lower bank part). Therefore, the first connection electrode CNE1 and the second connection electrode CNE2 may not be directly connected to each other by residues remaining on inner side surfaces of the bank layer BNL. Since the display device 10_2 includes a smaller number of electrodes RME and connection electrodes CNE in each subpixel SPXn, the display device 10_2 may include a greater number of subpixels SPXn per unit area. Furthermore, although the connection electrodes CNE1 and CNE2 are spaced apart from each other in a relatively narrow area, it is possible to prevent the connection electrodes CNE1 and CNE2 from being directly connected and thus causing light emission failure in a corresponding subpixel SPXn by the arrangement of the connection electrodes CNE.

In a display device according to an embodiment, different connection electrodes disposed in a subpixel may extend in different directions beyond a bank layer. Accordingly, an electrical short circuit between the different connection electrodes due to residues remaining on side surfaces of the bank layer may be prevented, and the display device may prevent light emission failure of the subpixel.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a first electrode disposed on a substrate and extending in a first direction;
    second electrodes spaced apart from the first electrode in a second direction, the first electrode being disposed between the second electrodes;
    light emitting elements disposed on the first electrode and the second electrodes;
    a bank layer extending in the first direction and the second direction and surrounding:
        an emission area in which the light emitting elements are disposed,
        a first sub-area disposed on a side of the emission area in the first direction, and
        a second sub-area disposed on another side of the emission area in the first direction; and
    connection electrodes disposed on at least one of the first electrode and the second electrodes and electrically connected to the light emitting elements, wherein
    each of the second electrodes comprises:
        an electrode stem part overlapping the bank layer in a plan view and extending in the first direction; and
        electrode branch parts branching from the electrode stem part and disposed partially in the emission area, and
    the connection electrodes comprise:
        a first connection electrode disposed on the first electrode, overlapping an upper bank part of the bank layer disposed above the emission area in a plan view, and having a part disposed in the first sub-area;
        a second connection electrode disposed on a first electrode branch part of one of the second electrodes, overlapping a lower bank part of the bank layer disposed below the emission area in a plan view, and having a part disposed in the second sub-area; and
        a third connection electrode disposed on second electrode branch parts of different second electrodes of the second electrodes and on the first electrode and surrounding a part of the first connection electrode.

2. The display device of claim 1, wherein
    the first connection electrode is spaced apart from the lower bank part of the bank layer in the first direction, and
    the second connection electrode is spaced apart from the upper bank part of the bank layer in the first direction.

3. The display device of claim 2, wherein
    the third connection electrode comprises:
        a first extension part disposed on the second electrode branch part of one of the second electrodes;
        a second extension part disposed on the first electrode and spaced apart from the first connection electrode; and
        a first connection part electrically connecting the first extension part and the second extension part, and
    the first connection part is disposed on the lower bank part of the bank layer.

4. The display device of claim 3, wherein each of the first extension part and the second extension part is spaced apart from the upper bank part of the bank layer in the first direction.

5. The display device of claim 1, further comprising:
    a first insulating layer disposed on the first electrode and the second electrodes;
    a second insulating layer disposed on the light emitting elements; and
    a third insulating layer disposed on the second insulating layer,
    wherein the light emitting elements are disposed between the first insulating layer and the second insulating layer.

6. The display device of claim 5, wherein
    the first connection electrode and the second connection electrode are disposed on the third insulating layer, and
    the third connection electrode is disposed between the second insulating layer and the third insulating layer.

7. The display device of claim 5, wherein
    the first connection electrode and the second connection electrode are disposed between the second insulating layer and the third insulating layer, and
    the third connection electrode is disposed on the third insulating layer.

8. The display device of claim 5, wherein
    the first connection electrode electrically contacts the first electrode through a first contact part disposed in the first sub-area,
    the first contact part penetrates the first insulating layer, the second insulating layer, and the third insulating layer to expose a part of the first electrode,
    the second connection electrode electrically contacts one of the second electrodes through a second contact part disposed in the second sub-area, and
    the second contact part penetrates the first insulating layer, the second insulating layer, and the third insulating layer to expose a part of the second electrode.

9. The display device of claim 5, wherein
the first electrode extends from the first sub-area to the emission area and the second sub-area,
the first electrode is disposed on a first electrode contact hole overlapping the upper bank part of the bank layer in a plan view, and
each of the second electrodes is disposed on a second electrode contact hole formed in a part of the bank layer which extends in the first direction.

10. The display device of claim 9, further comprising:
a wiring connection electrode disposed in the first sub-area and spaced apart from the first electrode, wherein
a first separation part is disposed between the wiring connection electrode and the first electrode,
the first electrode is spaced apart from another first electrode in the first direction, and
a second separation part disposed in the second sub-area and between the first electrode and the another first electrode.

11. The display device of claim 1, further comprising:
a first bank pattern disposed between the substrate and the first electrode; and
second bank patterns disposed between the substrate and the second electrodes, respectively, wherein
the first bank pattern does not overlap in a plan view a part of the bank layer which extends in the first direction, and
each of the second bank patterns overlaps in a plan view the part of the bank layer which extends in the first direction.

12. The display device of claim 11, wherein the light emitting elements comprise:
a first light emitting element disposed between the first bank pattern and one of the second bank patterns and disposed on the first electrode and the second electrode branch part of one of the second electrodes; and
a second light emitting element disposed between the first bank pattern and another one of the second bank patterns and disposed on the first electrode and the first electrode branch part of another one of the second electrodes.

13. The display device of claim 12, wherein
the first connection electrode electrically contacts a first end of the first light emitting element,
the second connection electrode electrically contacts a second end of the second light emitting element, and
the third connection electrode electrically contacts a second end of the first light emitting element and a first end of the second light emitting element.

14. A display device comprising:
a first electrode disposed on a substrate and extending in a first direction;
a second electrode extending in the first direction and spaced apart from the first electrode in a second direction;
light emitting elements disposed on the first electrode and the second electrode;
a bank layer surrounding an emission area in which the light emitting elements are disposed and sub-areas spaced apart from the emission area in the first direction;
a first connection electrode disposed on the first electrode and electrically connected to the light emitting elements; and
a second connection electrode disposed on the second electrode and electrically connected to the light emitting elements, wherein
the first connection electrode overlaps a lower bank part of the bank layer disposed below the emission area in a plan view and has a part disposed in a first sub-area disposed on a side of the emission area in the first direction, and
the second connection electrode overlaps an upper bank part of the bank layer disposed above the emission area in a plan view and has a part disposed in a second sub-area disposed on another side of the emission area in the first direction.

15. The display device of claim 14, wherein
the first connection electrode is spaced apart from the upper bank part of the bank layer in the first direction, and
the second connection electrode is spaced apart from the lower bank part of the bank layer in the first direction.

16. The display device of claim 15, wherein
the first electrode and the second electrode are disposed over the emission area, the first sub-area, and the second sub-area to partially overlap the bank layer in a plan view,
the first electrode is disposed on a first electrode contact hole overlapping the bank layer in a plan view, and
the second electrode is disposed on a second electrode contact hole overlapping the bank layer in a plan view.

17. The display device of claim 14, further comprising:
a first insulating layer disposed on the first electrode and the second electrode; and
a second insulating layer disposed on the light emitting elements, wherein
the light emitting elements are disposed directly on the first insulating layer.

18. The display device of claim 17, wherein each of the first connection electrode and the second connection electrode is disposed on the first insulating layer and has a part in contact with the second insulating layer.

19. The display device of claim 17, wherein
the first connection electrode electrically contacts the first electrode through a first contact part disposed in the first sub-area,
the first contact part penetrates the first insulating layer and the second insulating layer,
the second connection electrode electrically contacts the second electrode through a second contact part disposed in the second sub-area, and
the second contact part penetrates the first insulating layer and the second insulating layer.

20. The display device of claim 14, further comprising:
a first bank pattern disposed between the substrate and the first electrode; and
a second bank pattern disposed between the substrate and the second electrode,
wherein the light emitting elements are disposed between the first bank pattern and the second bank pattern.

* * * * *